(12) United States Patent
Easterbrook

(10) Patent No.: US 11,225,868 B1
(45) Date of Patent: Jan. 18, 2022

(54) METHOD FOR INTEGRAL TURBINE BLADE REPAIR

(71) Applicant: STRESSWAVE, INC., Seattle, WA (US)

(72) Inventor: Eric T Easterbrook, Seattle, WA (US)

(73) Assignee: STRESSWAVE, INC., Seattle, WA (US)

( * ) Notice: Subject to any disclaimer, the term of this patent is extended or adjusted under 35 U.S.C. 154(b) by 302 days.

(21) Appl. No.: 16/261,374

(22) Filed: Jan. 29, 2019

Related U.S. Application Data

(60) Provisional application No. 62/624,627, filed on Jan. 31, 2018.

(51) Int. Cl.
    *G01N 3/42*      (2006.01)
    *F01D 5/00*      (2006.01)
    (Continued)

(52) U.S. Cl.
CPC .............. *F01D 5/005* (2013.01); *B23P 6/045* (2013.01); *G01B 7/26* (2013.01); *G01N 3/42* (2013.01);
(Continued)

(58) Field of Classification Search
CPC ................... B25J 9/1697; G03B 15/05; G03B 2215/0514; G03B 15/02; H04N 5/2256;
(Continued)

(56) References Cited

U.S. PATENT DOCUMENTS

| 2,415,573 A | 2/1947 | Adams et al. |
| 2,554,328 A | 5/1951 | Grimes |

(Continued)

FOREIGN PATENT DOCUMENTS

| CN | 101995378 | 3/2011 |
| CN | 1924868 | 4/2011 |

(Continued)

OTHER PUBLICATIONS

EP 12746451—Supplemental European Search Report (dated May 12, 2017) (2 pages).
(Continued)

*Primary Examiner* — Rick K Chang
(74) *Attorney, Agent, or Firm* — R. Reams Goodloe, Jr.

(57) ABSTRACT

A method for design in indenter apparatus for plastically straining a workpiece including a weld nugget, adjacent heat affected zones, and the adjacent parent-metal portions or new metal portions, throughout the weld nugget volume and heat affected zone, to produce threshold levels of uniform plastic strain which meet or exceed plastic strain levels that provide, when the weld nugget and heat affected zone is heat treated, a recrystallized grain structure metallurgically comparable to the grain structure of the parent-metal. The indenter provided by the optimization methods may be used to advantageously in a method for the repair of damaged rotors, including integrally bladed rotors, in gas turbine engines, such as in aircraft engines. Blades for gas turbine engines, including integrally bladed rotors, may be advantageously provided constructed by the methods taught.

59 Claims, 13 Drawing Sheets

Optimized Indenter Profile with Applied Depth (APD)

(51) Int. Cl.
  *B23P 6/04* (2006.01)
  *G01B 7/26* (2006.01)
  *G06F 30/17* (2020.01)

(52) U.S. Cl.
  CPC ........ *G06F 30/17* (2020.01); *F05D 2230/232* (2013.01); *F05D 2230/80* (2013.01); *F05D 2260/821* (2013.01); *F05D 2260/941* (2013.01)

(58) Field of Classification Search
  CPC .................... H04N 5/2253; G06T 7/13; G05B 2219/45064; B65G 47/904; C04B 35/10; C04B 35/18; C04B 35/622; C04B 35/64; F27D 2021/026; F27D 3/0021; F27D 5/0006; F27D 21/02; F27M 2001/1504; F27M 2003/04
  See application file for complete search history.

(56) References Cited

U.S. PATENT DOCUMENTS

| | | | |
|---|---|---|---|
| 3,170,534 A * | 2/1965 | Kelley | ................. B60K 17/165 |
| | | | 180/308 |
| 3,301,994 A | 1/1967 | Seeloff | |
| 3,415,977 A | 12/1968 | Bush | |
| 3,613,106 A | 10/1971 | Cavagnero | |
| 4,784,827 A | 11/1988 | Hiraga et al. | |
| 5,022,581 A | 6/1991 | Zimmer | |
| 5,520,589 A * | 5/1996 | Dewald | ................... F16H 48/08 |
| | | | 475/160 |
| 5,581,489 A | 12/1996 | Groothuis et al. | |
| 5,770,832 A | 6/1998 | Carnes et al. | |
| 5,855,699 A | 1/1999 | Oyama et al. | |
| 6,037,949 A | 3/2000 | DeRose et al. | |
| 6,103,027 A | 8/2000 | Glasier, Jr. et al. | |
| 6,120,624 A | 9/2000 | Vogt et al. | |
| 6,333,484 B1 | 12/2001 | Foster et al. | |
| 6,338,765 B1 | 1/2002 | Statnikov | |
| 6,568,077 B1 | 5/2003 | Hellemann et al. | |
| 6,876,956 B1 | 4/2005 | Cirak et al. | |
| 68,997,738 | 5/2005 | Buck | |
| 6,926,970 B2 | 8/2005 | James | |
| 7,378,622 B2 | 5/2008 | Dydo et al. | |
| 7,516,534 B2 | 4/2009 | Easterbrook et al. | |
| 7,825,348 B2 | 11/2010 | Bouet et al. | |
| 8,414,267 B2 | 4/2013 | Ganesh et al. | |
| 10,156,140 B2 | 12/2018 | Walker et al. | |
| 10,871,218 B2 * | 12/2020 | Schwark | ................. F16H 48/08 |
| 2003/0085257 A1 | 5/2003 | James et al. | |
| 2005/0150871 A1 | 7/2005 | Offer | |
| 2005/0167401 A1 | 8/2005 | Easterbrook | |
| 2006/0042729 A1 | 3/2006 | Kottilingam et al. | |
| 2006/0157165 A1 | 7/2006 | Kottilingam et al. | |
| 2007/0261458 A1 | 11/2007 | Oruganti et al. | |
| 2008/0000947 A1 | 1/2008 | Derrien et al. | |
| 2009/0183804 A1 | 7/2009 | Zhao et al. | |
| 2014/0161618 A1 | 6/2014 | Walker et al. | |
| 2016/0377518 A1 | 12/2016 | Puchnin et al. | |
| 2017/0298735 A1 | 10/2017 | Walker et al. | |
| 2018/0253516 A1 * | 9/2018 | Shimano | ................. G06F 30/20 |
| 2020/0084382 A1 * | 3/2020 | Furukawa | ................. G03B 5/04 |
| 2020/0238519 A1 * | 7/2020 | Diankov | ................... G06T 7/73 |
| 2020/0298404 A1 * | 9/2020 | Theobald | ................. B25J 9/041 |

FOREIGN PATENT DOCUMENTS

| | | |
|---|---|---|
| CN | 10198209 | 3/2012 |
| CN | 103593506 | 2/2014 |
| EP | 2675583 | 12/2013 |
| GB | 1510299 A | 5/1978 |
| JP | S5414347 | 2/1979 |
| WO | WO 2012/112779 A2 | 8/2012 |

OTHER PUBLICATIONS

PCT/US12/025453—International Search Report and Written Opinion dated Aug. 17, 2012 (20 pages).
PCT/US12/025453—Response to Written Opinion dated filed Dec. 17, 2012 (55 pages).
PCT/US12/025453—International Preliminary Report on Patentability dated Apr. 18, 2013 (53 pages).

* cited by examiner

Flat Weld Nugget

Protruding Weld Nugget

Receding Weld Nugget

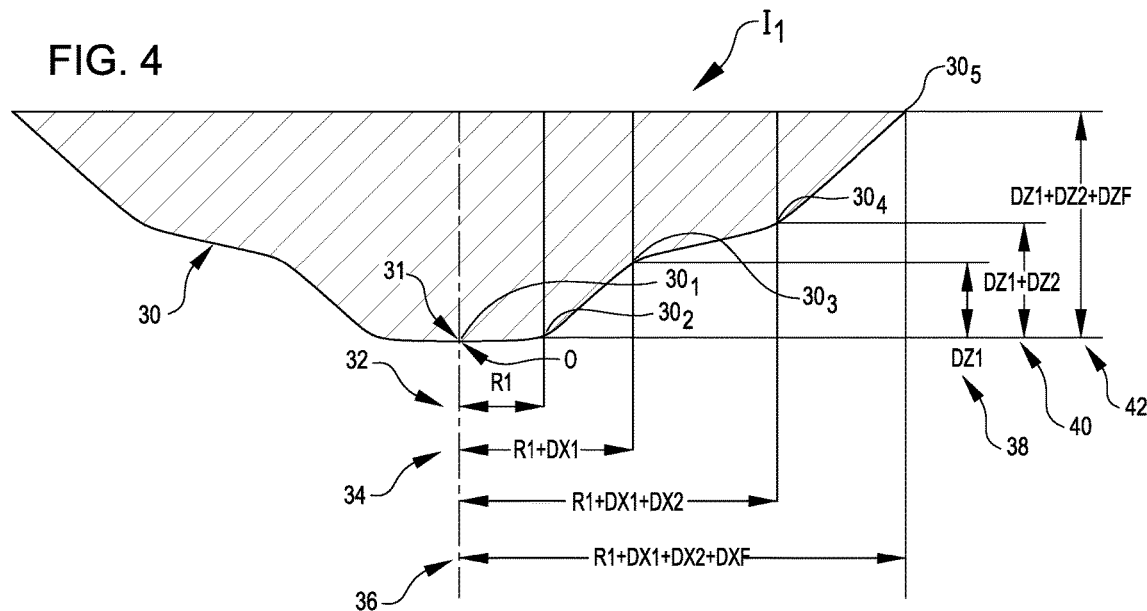
Spline Points Tool Profile Optimization Variable Coordinates
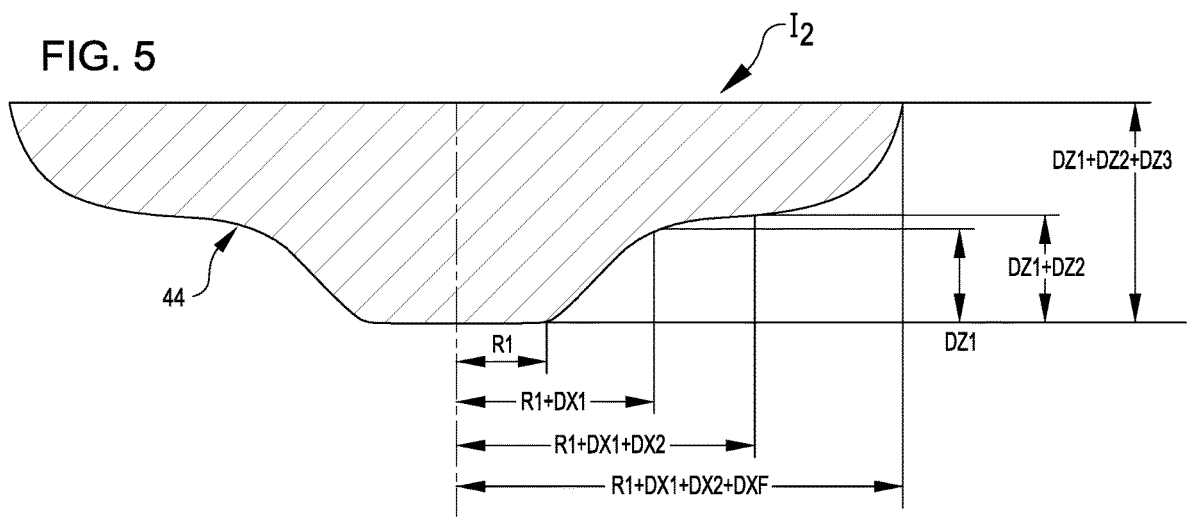
Spline Tool Profile Optimization Variable Coordinates Optimized Indenter Profile with Applied Depth (APD)

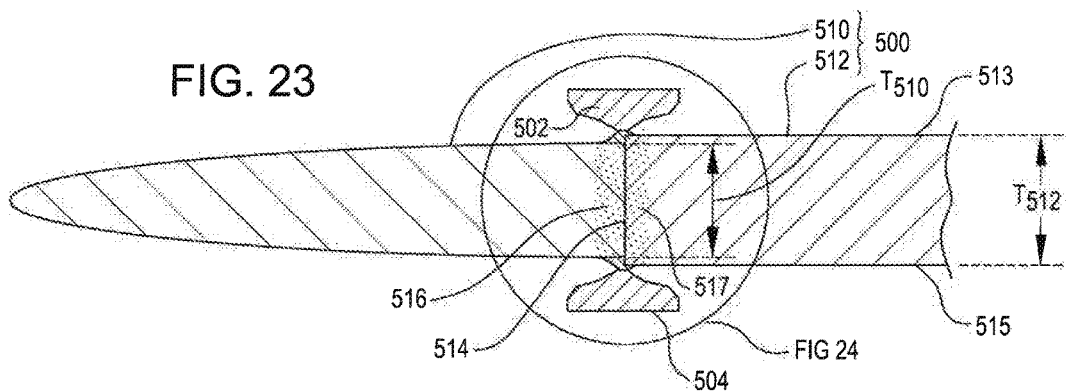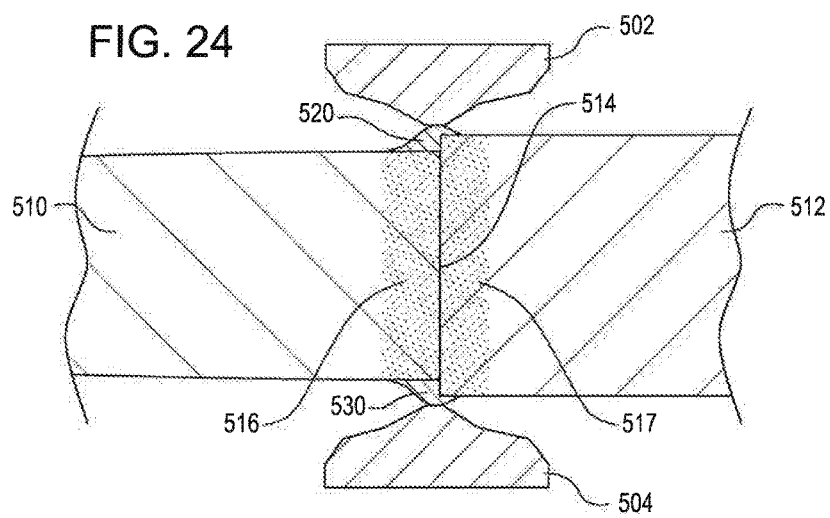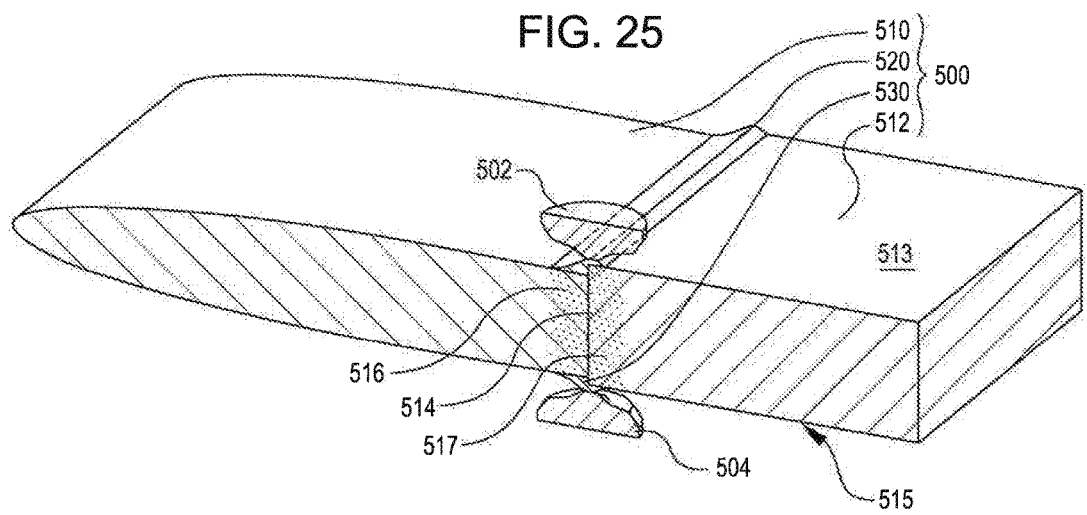

METHOD FOR INTEGRAL TURBINE BLADE REPAIR

RELATED PATENT APPLICATIONS

This application claims priority from prior U.S. Provisional Patent Application Ser. No. 62/624,627, filed Jan. 31, 2018, entitled APPARATUS AND METHOD FOR INTEGRAL TURBINE BLADE REPAIR, the disclosure of which is incorporated herein in its entirety, including the specification, drawing, and claims, by this reference.

STATEMENT OF GOVERNMENT INTEREST

Not Applicable.

COPYRIGHT RIGHTS IN THE DRAWING

A portion of the disclosure of this patent document contains material that is subject to copyright protection. The patent owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to apparatus and methods for the repair of turbine blades, and in particular, to the repair of damaged gas turbine engine blades.

BACKGROUND

Gas turbine engines, such as aircraft engines, typically include compressors, turbines and/or rotors which have rotating elements that are used (a) for compressing air prior to combustion, and then (b) for transforming the energy contained in hot, pressurized combustion gases into rotational motion. The aerodynamic components of the rotating components are the blades. Rotors may be designed with removable blades or with integral blades. However, it is often rather costly to manufacture a rotor that is configured to mount removable blades onto a common structure. The blades and common structure must be precisely formed and attached so that the final rotor is balanced. However, since such a configuration simplifies the repair of individual damaged blades, the additional cost may sometimes be justified. This simplifies blade repair, since a blade needing repair can be removed, and a new blade can be attached.

On the other hand, high quality, usually lower cost integrally bladed rotors may be formed using a high strength alloy, the metal of which is manufactured in a "parent-metal" metallurgical state, typically characterized by having an equiaxed, fine grain structure. Although the manufacture of integrally bladed rotors has become practical, the repair of such rotors remains problematic. One method of repair called "blending" simply grinds away and polishes the damaged sites on rotors. This improves reliability somewhat, since without utilization of the blending method to repair rotor blades, the damaged locations can form nucleation sites for cracks to propagate through the damaged rotor blade. Unfortunately, the removal of material during the blending process may affect the balance of the rotor. Consequently, the original equipment manufacturers (OEMs) of gas turbine engines place strict limits on the amount of blending that can be utilized.

As an alternate method of repair, the original equipment manufacturers may allow removal and replacement of metal in their repair specifications, but they usually require that the replaced metal as well as the weld nugget must have the metallurgical properties of the parent-metal. However, prior art processes available for welding a new blade in place, or for adding a piece of a blade by welding, typically results in a metallurgical difference between the metal that melts and resolidifies due to the act of welding (hereinafter referred to as a "weld nugget") and the "parent-metal"—which includes adjacent unwelded metal, as well as sacrificial metal elements and new-metal patches. In such cases, the weld may be weaker than the original parent-metal, particularly in fatigue strength. Typically, the grain growth that occurs in the welded area after post-weld heat treating leads to the fatigue life reduction. Because of such difficulties and limitations, no welding technology has yet become qualified for repair of integrally bladed rotors.

Other processing methods such as shot peening, low plasticity burnishing, and laser shock peening can be utilized to improve fatigue resistance of the weld by imparting beneficial residual stress. However, the stresses imparted by such techniques may be limited in depth, and as a result, uniform threshold stress may not exist throughout the weld nugget in a weld repaired rotor blade that has been treated by such techniques.

However, one improved method for processing welded rotor structure is described in United States Patent Application Publication No. 2014/0161618 A1, by Walker et al., published on Jun. 12, 2014, and entitled Metal Joining and Strengthening Methods Utilizing Microstructural Enhancement, the disclosure of which, including the specification, claims, and drawing figures, is incorporated herein in its entirety by this reference. The method described therein provides for a through-the-thickness of weld-repaired rotors leading to a fine grain structure—after heat treatment—which is equal to the original parent-metal. The method described is utilized in the blade repair sequence after welding but before heat treatment or final machining. Yet, to achieve the necessary uniform stain fields in the weld nugget and adjacent heat affected zones, the end/working shape profiles of the indenting tools, and the process parameters for their use must be optimized. Moreover, since the damaged rotor blade and the repair site are located on an integrally bladed rotor, there is restricted access to the damaged rotor blade due to the blade spacing on the rotors, which limits access to areas on damaged blades which require treatment. As a consequence, it is difficult or impossible to provide access to the damaged and repair locations, and thus the ability to fully utilize the force application device that drives the indenting tools may be limited. As a result, many of the process parameters that must be considered during the indenting process must be optimized simultaneously, along with the uniform plastic strain patterns. Therefore, a limitation in any attempt to use the method of the above mentioned US Published Patent Application is that it does not teach how to determine and optimize an end profile shape for an indenting tool for a given rotor parent-metal and weld nugget combination. Another limitation of the method(s) taught by the above mentioned US Patent Application Publication is that it is does not teach how to determine the shape for a desirable surface profile for a weld nugget, nor how to optimize the surface profile of a weld nugget. Thus, there remains a need for a method and apparatus which provides the techniques necessary for successful determination and optimization of such requirements (e.g., surface profile for a weld nugget, and suitable shape for an indenter), in order to provide a repaired component which is metallurigically sound for return to service.

SUMMARY

Set out herein are exemplary methods for the design of indenters for plastically straining a workpiece including throughout a weld nugget, adjacent heat affected zones, and the adjacent parent-metal portions or new-metal portions, to produce at least threshold levels of uniform plastic strain which meet or exceed plastic strain levels that provide, when the weld nugget and heat affected zone are heat treated, a recrystallized grain structure metallurgically comparable to the grain structure of the parent-metal. Indenters provided by the optimization methods described herein may be used to advantageously in a method for the repair of damaged rotors, or portions thereof such as blades, or for blades in integrally bladed rotors, as may be used in gas turbine engines, such as in aircraft engines.

In order to adequately work a weld repaired rotor blade to achieve the necessary parameters for return to service, the indenter profile and processing parameters must meet a multiplicity of simultaneous requirements based on both the parent-metal properties, and on the weld parameters. The repaired components must meet or exceed specified threshold plastic strain level throughout weld nugget volume, must provide uniformity of plastic strain throughout weld nugget volume, should minimize applied tool force, as well as minimize overall blade distortion, and minimize dimple depth for maximum final machine cleanup. By way of providing or exceeding a specified plastic strain level via use of an indenting tool, grain growth in the weld is thus precluded during the subsequent heat treating process. The required level of plastic strain is typically at least about twenty five percent (25%) for typical metal alloys used in gas turbine engines, and uniform levels of plastic strain above that are even more desirable. Such a level of high induced plastic strain serves to disrupt the coarse grain crystal structure of the weld nugget resulting from the heat treat process.

In addition to a plastic strain threshold requirement, the uniformity of the plastic strain which is developed in the workpiece is implicitly required. Prior art indenting tool profiles of a variety of shapes may produce threshold plastic strains, but such prior art devices have failed to produce plastic strain to a substantially uniform degree throughout the weld nugget and the adjacent heat affected zone. The heat affected zone (also known in the art as the "HAZ") is the volume of material at or near the weld in which properties have been altered due to the heat from the weld. For example where resistance welding is utilized, the process relies on heating two parts, and as a consequence, some amount of HAZ is inevitable. The material within the HAZ undergoes a change in material properties, physically and/or chemically, which may or may not be beneficial to the final workpiece or to the weld joint itself. However, one goal in good resistance welding is to minimize the HAZ.

With respect to prior art indenter shapes, for example, a blunt truncated cone shape can produce uniform plastic strain in the interior of the part and at the outer radius of the tool near the surface, but leaves a bubble of "dead metal" that is not plastically strained immediately below the flat portion of the tool. In such a case, the dead metal has been merely translated below the surface without undergoing plastic strain. In a different example, a sharp conical indenter tool shape can eliminate dead metal, but may not produce threshold plastic strain levels at the interior of the weld without excessive applied tooling depth. Also, a conical tool undesirably requires additional applied depth, which results in a larger overall dimple depth, which then reduces the amount of metal available for final machining of the workpiece blade. Further, the use of a conical tool produces too much plastic strain at or near the blade surface, where the indenting tool contacts the workpiece. This phenomenon leads to increased and unwanted distortion locally, as well as in the full blade. Advantageously, it has been discovered that an optimally designed indenting tool as taught herein can produce uniform threshold plastic strains both at the surface and within the interior of the weld nugget while using tooling with minimal depth impact into the part being repaired.

Currently used manufacturing techniques (e.g., electron beam additive welding technology) can provide a controlled weld nugget surface profile.

Such manufacturing techniques may provide weld nugget surfaces in configurations which may be (a) flat or level with the parent-metal, (b) sunken in relation to the parent-metal, (or in relation to sacrificial metal elements and/or metal patches), or (c) raised in relation to the parent-metal (or in relation to sacrificial metal elements and metal patches). When using the method and apparatus taught therein, in each instance, the tool profile, and weld nugget surface profile, or both, are optimally shaped to enable the production of uniform threshold plastic strain throughout the weld nugget, after application of the indenter. It has been discovered that by identifying, specifying, and providing an advantageous weld nugget surface profile, the required indenter tooling shape may be simplified. Additionally, in some embodiments, the use of sacrificial elements—or at least portions thereof—may be minimized or eliminated. And in various embodiments, the tooling applied depth—i.e. the depth that the indenter is worked into the part being repaired—may be minimized. Thus, this technique may lead to a reduction in the amount of surface metal removal that may be required in the final machining operation.

An embodiment for an optimal tool profile for working a flat weld surface profile is shown in FIGS. 6, 7, 8 and 9. Such a tool profile may be produced by using a multi-level optimization program that runs in conjunction with a finite element solver. The optimization program sets up a design of experiments (DOE) method to determine optimal parameters. The finite element program calculates the plastic strains and their pattern, the internal energy, and the load on the part being repaired that is applied by the indenter, and returns the results to the optimization program. The optimization program in turn feeds a new set of parameters to the finite element program that better approximate the desired outcome of uniform threshold plastic strains. After a number of iterations, potentially hundreds, the method converges toward an optimum solution. In an embodiment, the optimization of the indenter tool profile is conducted by initially setting a series of coordinate point pairs as optimization variables for the production of a spline shape for the profile of the indenter to be used for a particular repair. The coordinate point pairs method can also be used for producing an indenter having an optimal smooth shape for the profile of the indenter, or faceted shape for the profile of the indenter, which in either case approximates the work effected by a smooth indenter shape. In such a method, an optimization variable parameter, such as a coordinate point pair, is allowed to vary between specified limits. For background and reference, a spline is shape for a profile described by a function that has specified values at a finite number of points and consists of segments of polynomial functions joined smoothly at these points, enabling it to be used for approximation and interpolation of functions. The coordinates can be simplified for sharp cones, truncated cones and other shapes. The spline methodology provides a large degree of freedom for forming indenter profile shapes necessary for producing the minimum threshold plastic strain, given the constraints faced for a particular rotor blade repair situation. In an embodiment, a smooth curved indenter profile may be developed and utilized. In some embodiments, a faceted shaped indenter profile may be more desirable as its distinct features may be more easily manufactured or more easily measurable than a smooth curve. In yet other embodiments, the combination of flat surfaces, in combination with selected curved surfaces, may provide an indenter in which energy imparted to a workpiece approximates the energy which would be imparted in the workpiece by an indenter having a surface defined by a spline curve.

In an embodiment, a large number of candidate profile shapes may be evaluated. Even though there are many degrees of freedom possible to produce the required indenter shape, in various embodiments, an optimal profile generally takes on a smoothly changing contour that resembles a modified truncated cone. The walls of the modified truncated cone may be straight, or concave, or convex, depending on the thickness and strength of the parent-metal, the width and thickness of the weld and of the dimensions of the heat affected zone, and the presence (or absence) of sacrificial elements. Typically, a flat end, or a radius, or a blend is required at the tip of the cone to reduce tool shear stresses that lead to high tool wear or to tool breakage. In other embodiments, an optimal faceted indenter profile shape may be provided in a faceted configuration.

Overall, the tool applied force—i.e. the displacement to the weld nugget—must be minimized because of the capacity limitations encountered in working in the restricted, inter blade space of the rotor. The minimized force also reduces the distortion energy imparted into the weld nugget. Too much distortion can warp the repaired blade beyond the ability to final machine it to shape. The required applied force used at the indenter, and displacement in the part undergoing repair, as well as internal energy of the welded assembly (e.g., weld nugget, parent-metal and new-metal, and or metal patches or sacrificial elements, as may appear in a particular repair situation) can be minimized by the optimization procedure provided herein.

In a further embodiment, additive metal may be applied to a workpiece above and/or below a weld nugget, and extending above and/or below the rotor portion of a workpiece adjacent a weld nugget. In this manner, a selected volume of metal in an additive weld profile provides for a shaped volumetric displacement, in combination with the selected indenter profile, to provide displacement in the weld nugget that provides a uniform threshold of plastic strain throughout the weld nugget. Surprisingly, the method of simultaneous optimization of additive weldment profile and of indenter profile for use on a particular workpiece greatly simplifies the shape of an indenter for such a workpiece. In many cases, the optimal indenter may be a truncated cone when used in combination with a protruding additive weld.

Thus, the aforementioned process may be varied by optimizing the shape of the weld nugget surface profile, while simplifying the surface profile of the indenter. In an embodiment, both profiles may be optimized in one simultaneous simulation. In this way the indenter surface profile and weld profile are matched, in a new way, which provides the advantages mentioned above with regard to raised weld nugget surface profiles.

BRIEF DESCRIPTION OF THE DRAWING FIGURES

The present method and apparatus provided herein will be described by way of exemplary embodiments, illustrated in the accompanying drawing figures in which like reference numerals denote like elements, and in which:

FIG. 1 provides a cross-sectional view to illustrate a weld repair structure wherein a weld nugget joins a parent-metal portion on one side of the weld nugget with a new-metal portion on the other side of the weld nugget, showing heat affected zones in both the parent-metal portion and in the new-metal portion, and wherein the weld nugget surface profile is flat, and has a uniform surface with the surfaces of the adjacent parent-metal portion and the adjacent new-metal portion.

FIG. 2 provides a cross-sectional view of a weld repair structure wherein a weld nugget joins a parent-metal portion on one side of the weld nugget with a new-metal portion on the other side of the weld nugget, showing heat affected zones in both the parent-metal portion and in the new-metal portion, and wherein the weld nugget has a protruding surface profile, and arises outwardly from the surfaces of the adjacent parent-metal portion and the adjacent new-metal portion.

FIG. 3 provides a cross-sectional view of a weld repair structure wherein a weld nugget joins a parent-metal portion on one side of the weld nugget with a new-metal portion on the other side of the weld nugget, showing heat affected zones in both the parent-metal portion and in the new-metal portion, and wherein the weld nugget has a receding surface profile, and indents inwardly from the surfaces of the adjacent parent-metal portion and the adjacent new-metal portion.

FIG. 4 shows a faceted cross-sectional indenter end profile where adjacent X, Z coordinate point pairs reveal the change in shape of the working end profile, and which shows how a series of points for defining the shape of the indenter surface are composites of the values of the preceding points, so that control of the spline produced by an optimization routine can be well controlled, using available computing capability; here the term faceted refers to the fact that the cross section is not yet shown as a spline, but only as a series of X, Z point pairs joined by straight line segments.

FIG. 5 shows an exemplary cross-sectional working end indenter profile using the spline X, Z coordinates just set out in FIG. 4 above, and further showing how an indenter shape may be defined as part of the optimization process described herein.

Figure 7:
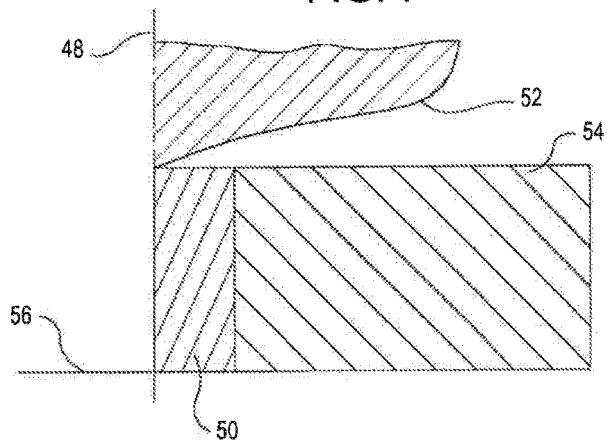

FIG. 7 illustrates an embodiment for the setup step of a finite element model that may be used in conjunction with an optimization program. Here, because two planes of model symmetry occur, only a one-quarter model of the tooling, weld, and parent-metal portions is required for complete solution. Use of the X-axis and Z-axis symmetry planes reduce the computation time required for solution without sacrificing accuracy.

Figure 6:
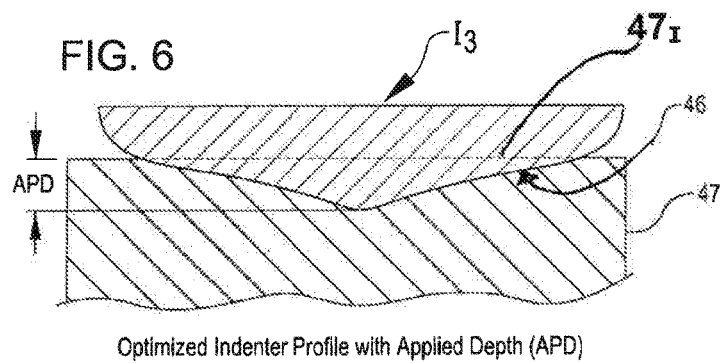
FIG. 6 shows an exemplary cross-sectional working end indenter profile, now additionally noting the applied depth (APD) of the tool, which is the depth at which the indenter is loaded or displaced into the parent-metal, or weld nugget, or new-metal portion, or sacrificial element.
Figure 8:
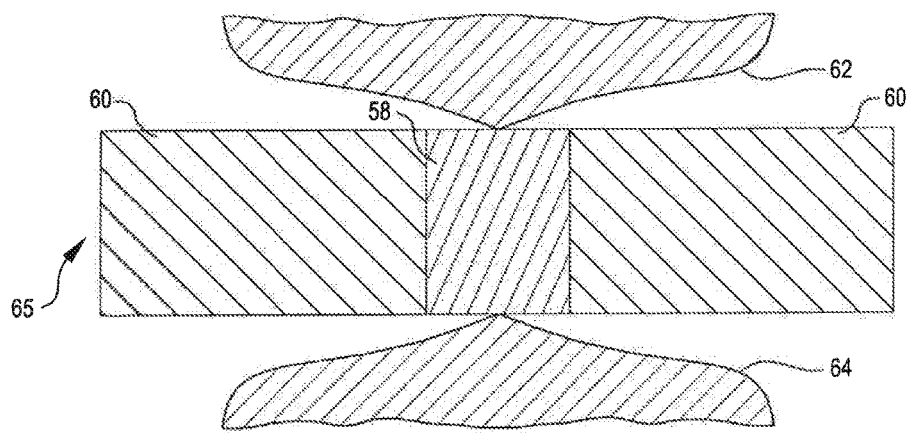
Figure 9:
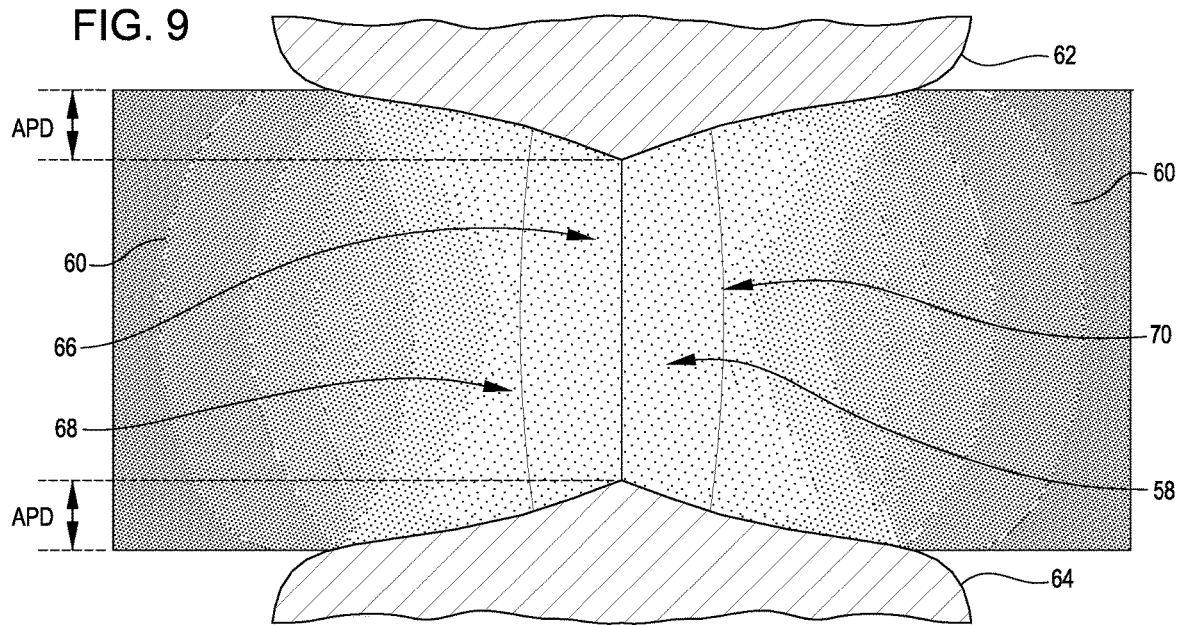

FIG. 8 illustrates the setup required for determining the optimized indenter profile from the geometry just illustrated in FIGS. 6 and 7 above, now shown with planes of symmetry in order to show the full finite element model utilized, and showing the use of parent-metal on either side of a weld nugget, and illustrating an upper indenter profile and a lower indenter profile, which move axially toward each other to apply force against the workpiece (parent-metal/weld nugget/parent-metal as shown) in order to engage the workpiece and to indent the workpiece to a selected tooling applied depth, as indicated in FIG. 9 below.

FIG. 9 shows the upper indenter and the lower indenter which have been driven to a specified tooling applied depth—i.e. the depth that the indenter is worked into the part being repaired—to create a barrel shaped weld nugget/parent-metal boundary, and a region of plastic strain equal to or greater than twenty five percent (25%) strain, as shown by grey density zones of shading (see FIG. 15), which ideally includes the entirety of the volume of the weld nugget and the adjacent heat affected zone.

Figure 10:
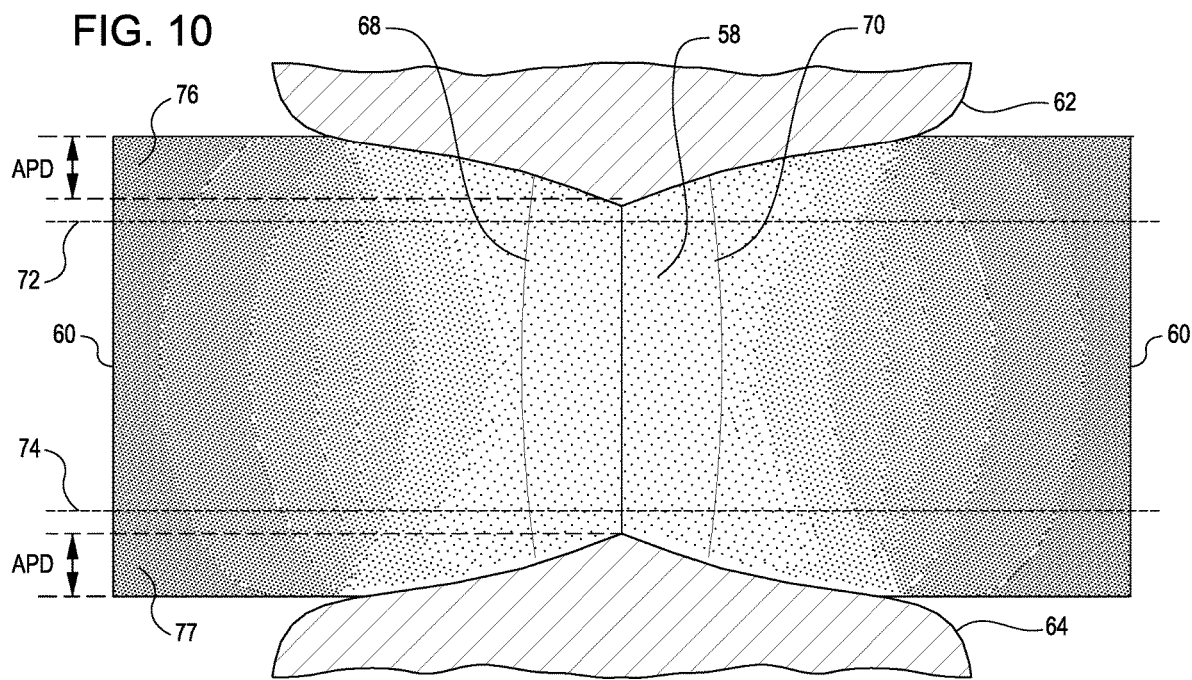

FIG. 10 is similar to FIG. 9, but now demonstrates the configuration for the upper indenter and the lower indenter which have been driven to a specified tooling applied depth—i.e. the depth that the indenter is worked into the part being repaired—to create a barrel shaped weld nugget/parent-metal boundary, and a region of plastic strain equal to or greater than twenty five percent (25%) strain, as shown by grey density shading (see FIG. 15), which ideally includes the entirety of the weld nugget volume, where the optimized indenter shape and the size of the parent-metal and weld nugget include sacrificial elements which are removed during a subsequent machining process.

Figure 11:
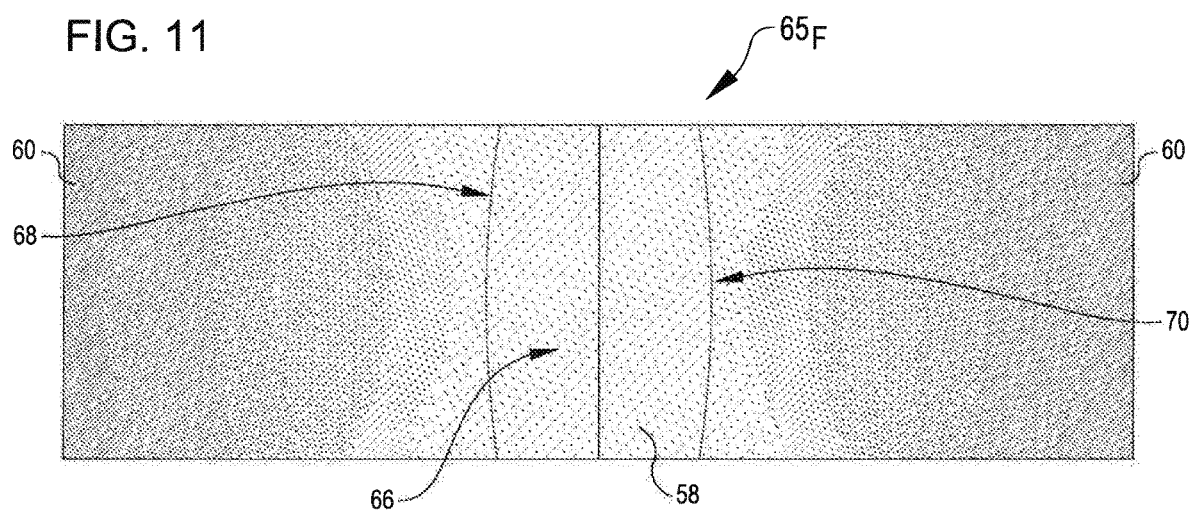

FIG. 11 is similar to FIG. 10, but now shows the finished component after the removal of the sacrificial elements that are removed during the machining process, namely sacrificial components of the parent-metal portions and sacrificial components of the weld nugget, and further reveals the minimum threshold strain, shown by grey shade density (see FIG. 15), which is obtained substantially throughout the final shape of the weld nugget.

Figure 12:
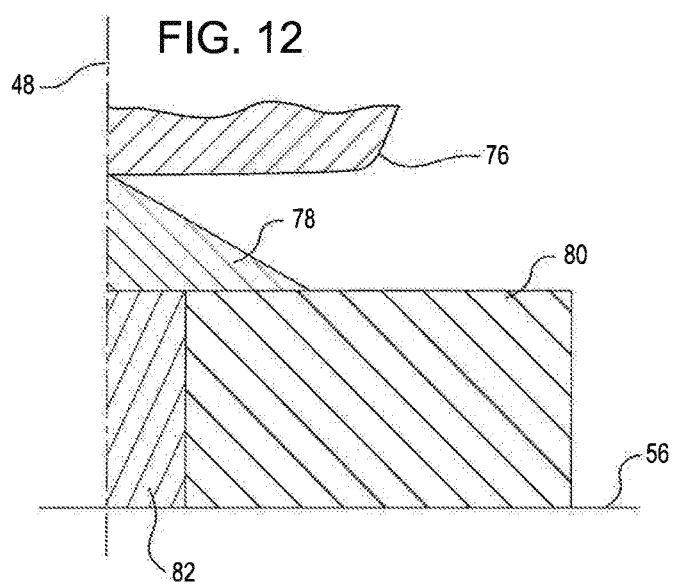

FIG. 12 illustrates the setup required for determining the optimized indenter profile for the workpiece geometry illustrated, showing only a one-quarter model of the tooling, parent-metal, a weld nugget, and an additive welding portion. Again, because two planes of model symmetry occur, only a one-quarter model of the tooling, weld, and parent-metal portions is required for complete solution. Use of the X-axis and Z-axis symmetry planes reduce the computation time required for solution without sacrificing accuracy. Thus, the ¼ weld nugget, the ¼ parent-metal, and the Y end indenter profile are the key elements used in the finite element model.

Figure 13:
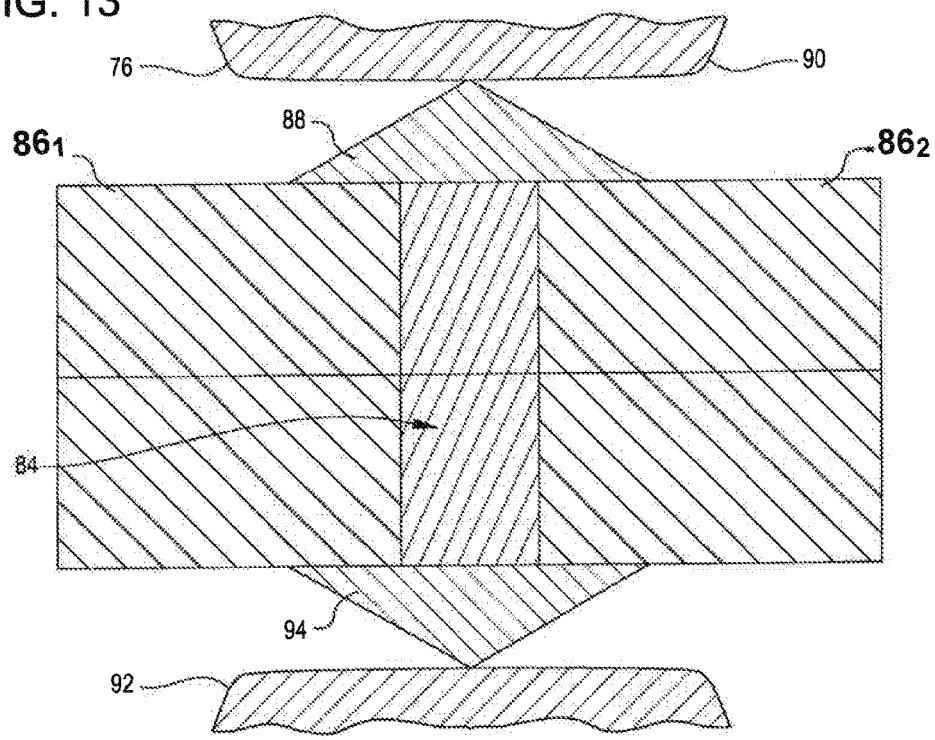

FIG. 13 shows an embodiment for setting up analysis for determining an optimized indenter profile from the design just illustrated in FIG. 12 above, now shown with planes of symmetry in order to illustrate the full finite element model with clarity. Here, the parent-metal is enclosed in the two rectangular boxes on both the right and left hand sides of the figure, and the weld nugget is centered between the parent-metal portions. An upper optimized additive welding profile and a lower optimized welding profile are shown as triangular in shape, as may be provided and shaped by additive manufacturing techniques. A set of indenters having an optimized and simplified upper indenter profile and an optimized and simplified lower indenter profile are illustrated; in use, these optimized indenters move axially toward each other during the application of a load on the structure by the optimized indenters.

Figure 14:
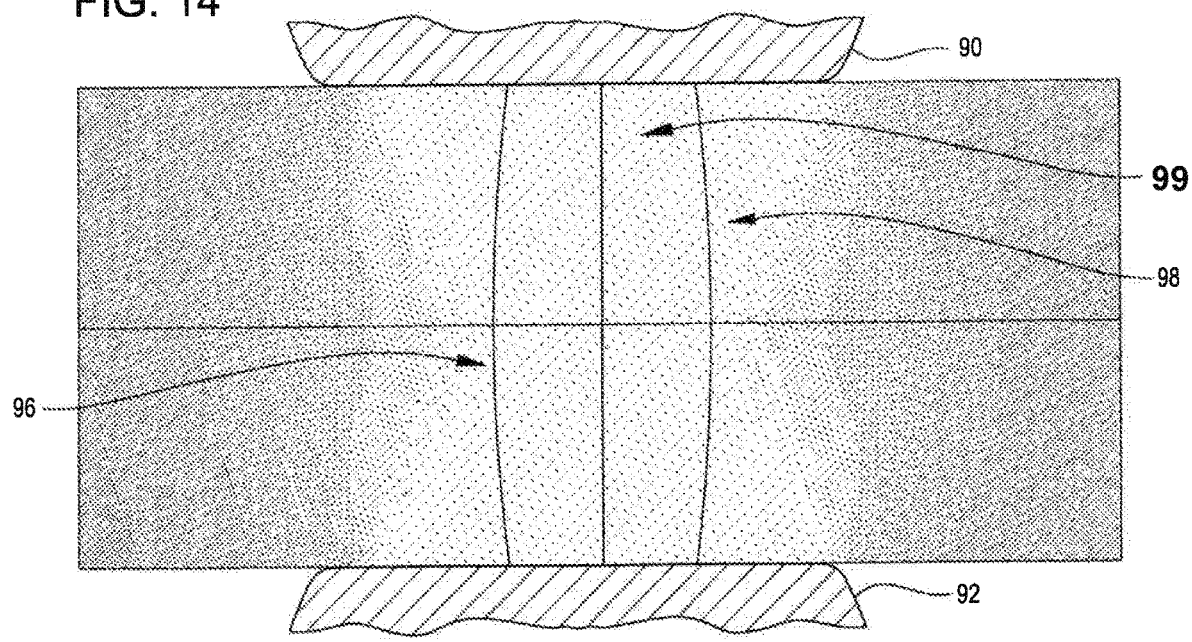

FIG. 14 is shows the result of application of force to the workpiece just illustrated in FIG. 13 above, now showing how the use of an optimized and simplified upper and lower indenter profiles (as seen in FIGS. 12 and 13) are utilized to drive the additive upper and lower weldment portions to a specified depth, to provide a barrel shaped weld nugget/parent-metal boundary, which includes a region of plastic strain equal to or greater than twenty five percent (25%) strain, as shown in grey density shading (see FIG. 15), and in this embodiment, with the minimum threshold plastic strain of twenty five percent (25%) nearly filling the entire weld nugget.

Figure 15:
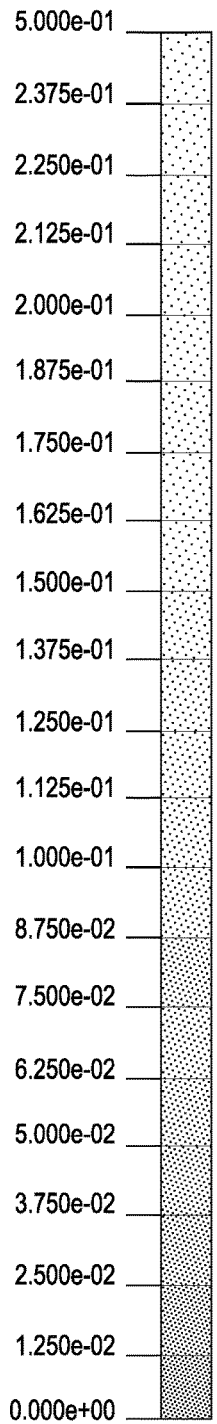

FIG. 15 provides a grey shade density chart which identifies the plastic strain fringe levels illustrated by the grey shade density zones depicted in FIGS. 9, 10, 11, and 14.

Figure 16:
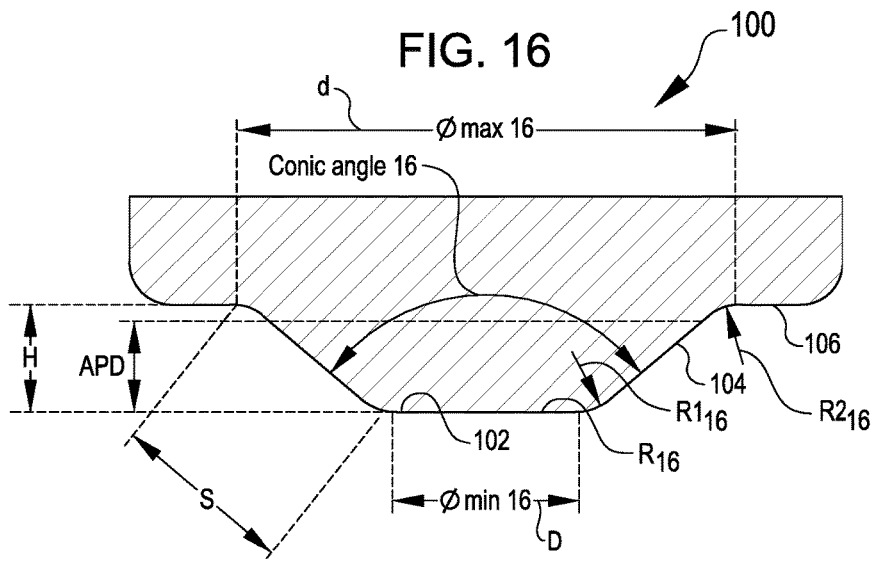

FIG. 16 illustrates an indenter shaped fundamentally like a conical frustum, however, a blended outer end has been utilized.

Figure 17:
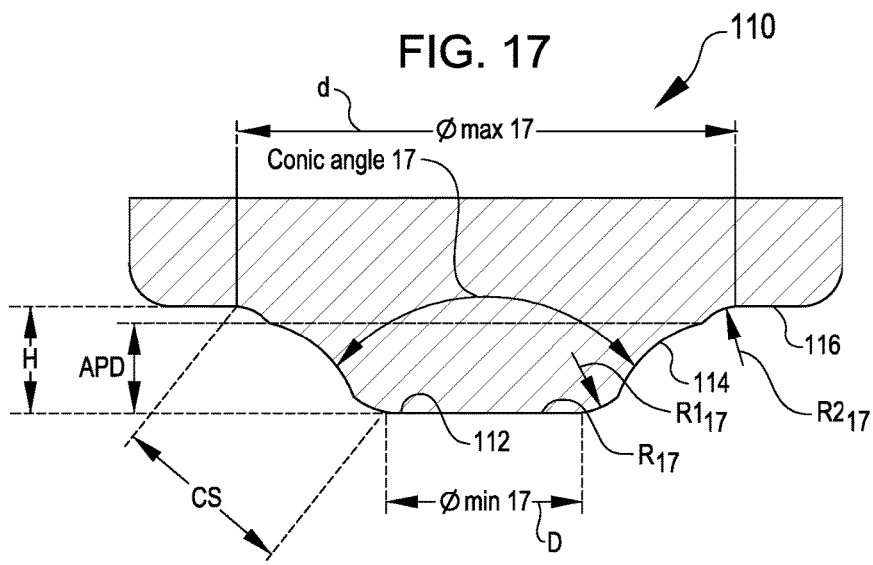

FIG. 17 illustrates an indenter shaped fundamentally like a conical frustum, however, the sloping sidewalls, rather than in the straight line shape of a cone, are provided in a concave, inwardly protruding fashion, and thus will be referred to herein as a pseudo conical frustum with concave sloping sidewalls.

Figure 18:
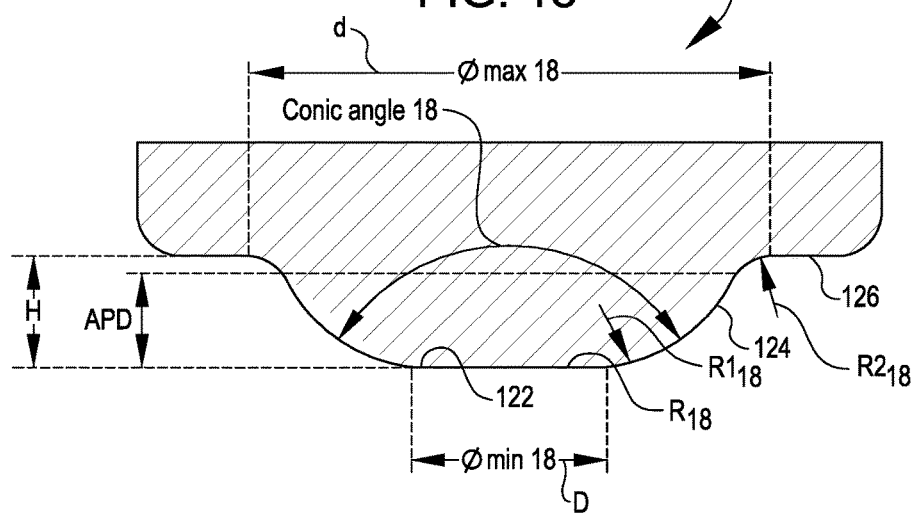

FIG. 18 illustrates an indenter shaped fundamentally like a conical frustum, however, the sloping sidewalls, rather than in the straight line shape of a cone, are provided in a convex, outwardly protruding fashion, and thus will be referred to herein as a pseudo conical frustum with convex sloping sidewalls.

Figure 19:
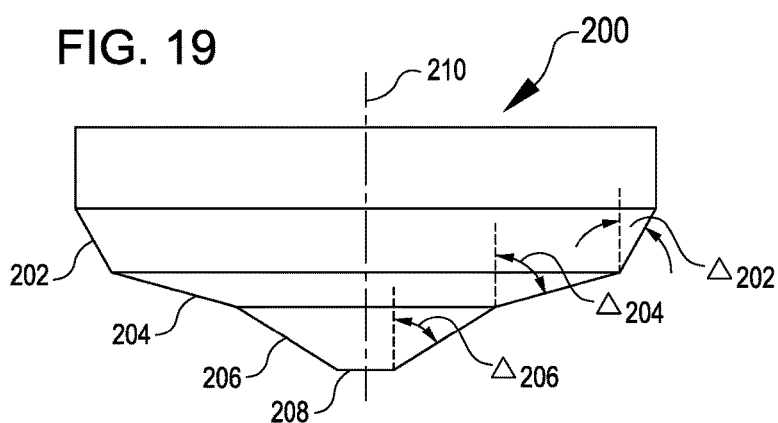

FIG. 19 illustrates an indenter which is fabricated using a faceted technique, wherein facets are provided rather than a smooth curve for the shape of the working end of the indenter.

Figure 20:
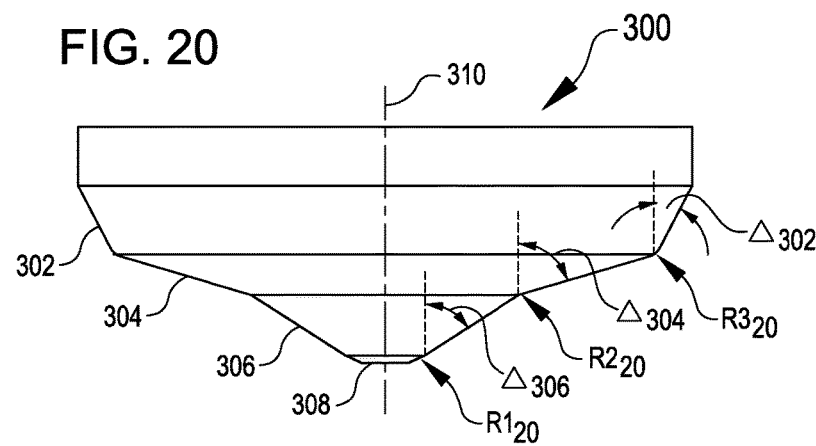

FIG. 20 illustrates an indenter which is fabricated using a faceted technique, wherein facets are provided rather than a smooth curve for the shape of the working end of the indenter, similar to the indenter just shown in FIG. 19, but now additionally utilizing the technique of providing a smooth, blended radius between each facet portion.

Figure 21A:
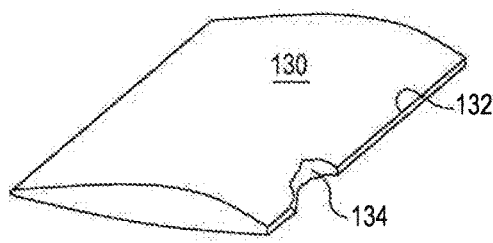

FIG. 21A illustrates a rotor blade which has been damaged, and in which a repair maybe provided utilizing the method(s) taught herein.

Figure 21B:
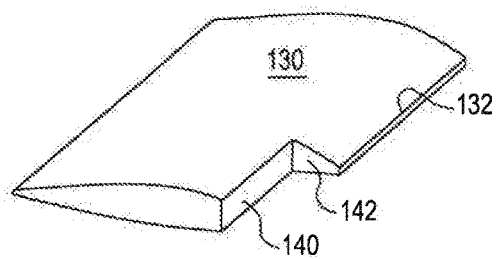

FIG. 21B illustrates a damaged rotor blade as just shown in FIG. 21A, but now showing the removal of the damaged area and adjacent material, as may be practiced as a step in the repair of rotor blade utilizing the method(s) taught herein.

Figure 21C:
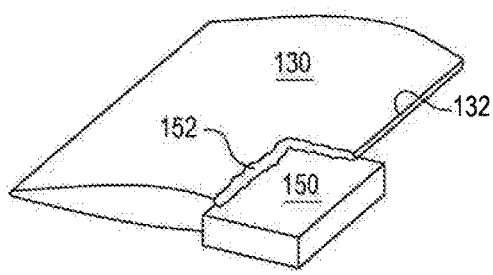

FIG. 21C illustrates a damaged rotor blade as just shown in FIG. 21A, and in FIG. 21B, but now showing the attachment by welding a new-metal repair patch to the rotor blade, as may be practiced as a step in the repair of rotor blade utilizing the method(s) taught herein.

Figure 22:
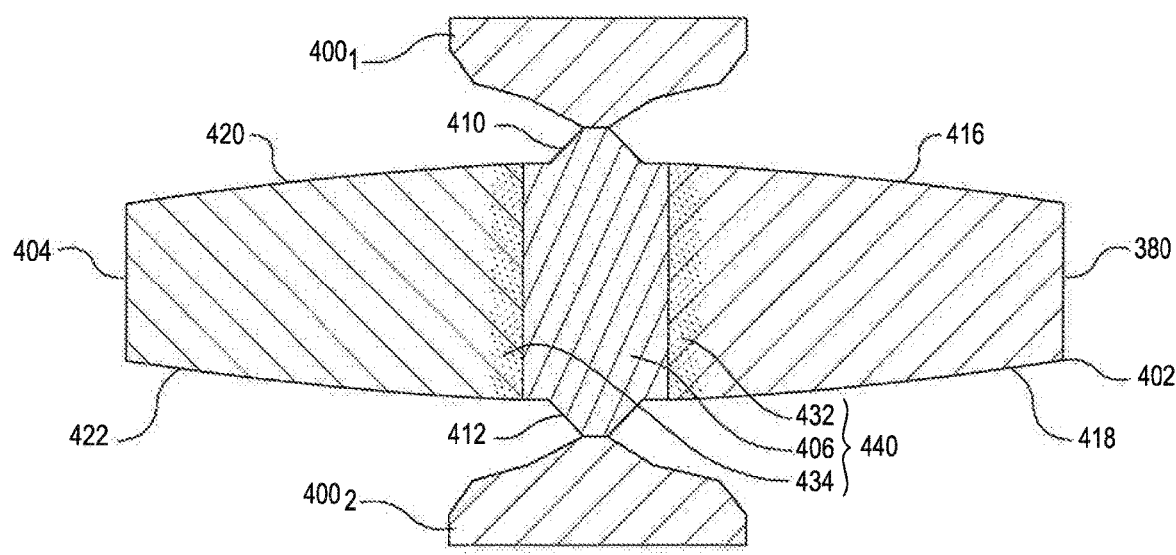

FIG. 22 illustrates the use of a pair of indenters on a workpiece, wherein the workpiece includes a first parent-metal portion and a second parent-metal portion joined by a weld nugget, showing heat affected zones in both the parent-metal portion and in the new-metal portion, with the weld nugget including an additive protruding metal portion on a first side and on a second side.

FIG. 23 provides a cross-sectional view of a workpiece, illustrating the set up for the use of a pair of indenters on a workpiece, wherein the workpiece includes a first parent-metal portion and a repair patch which have been joined together by welding to form a weld nugget therebetween, showing heat affected zones in both the parent-metal portion and in the new-metal portion, and which includes an additive protruding metal portion on a first side and on a second side.

FIG. 24 is a close up partial cross-sectional view of the workpiece just illustrated in FIG. 23 above, showing the set up for the use of a pair of indenters on a workpiece, wherein the workpiece includes a first parent-metal portion and a repair patch which have been joined together by welding, showing heat affected zones in both the parent-metal portion and in the new-metal portion, as well as an additive protruding metal portion on a first side and on a second side.

FIG. 25 is a perspective view of the workpiece just illustrated in FIG. 23 above, showing the set up for the use of a pair of indenters on a workpiece, wherein the workpiece includes a first parent-metal portion and a repair patch which have been joined together by welding, additionally showing the heat affected area, as well as an additive protruding metal portion on a first side and on a second side.

Figure 26:
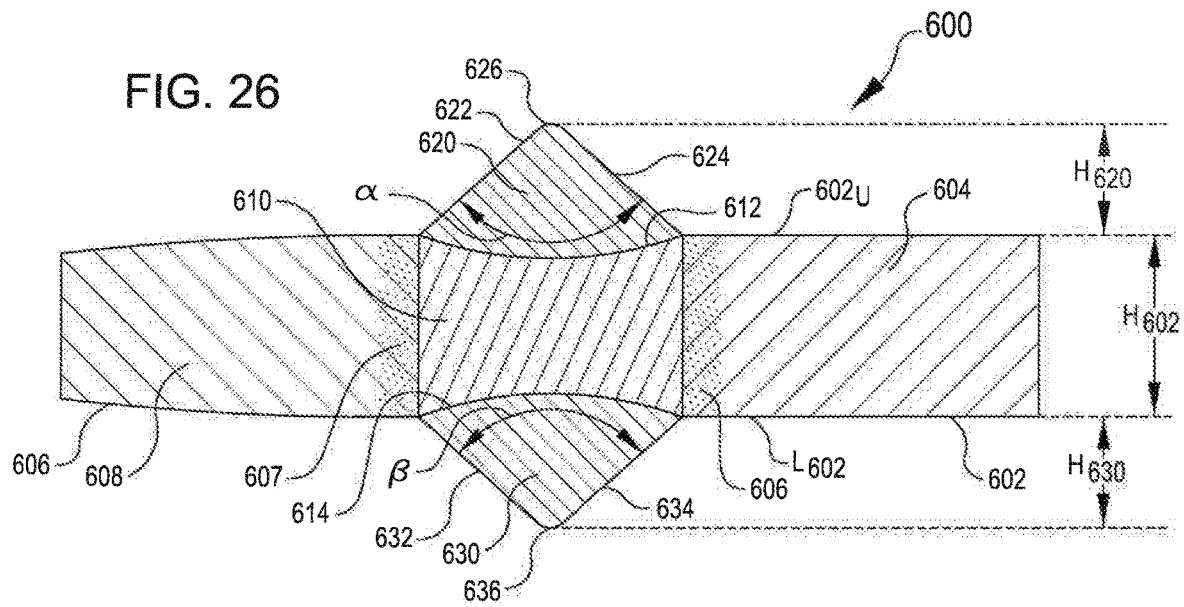

FIG. 26 is a cross-sectional view of a welded plate and patch, with a weld nugget between the welded plate and the patch, showing heat affected zones in both the parent-metal portion and in the new-metal portion, and with additive metal portions having optimized profiles on the top and bottom surfaces of the workpiece, and wherein the additive metal portions are provided with smooth surface profiles.

Figure 27:
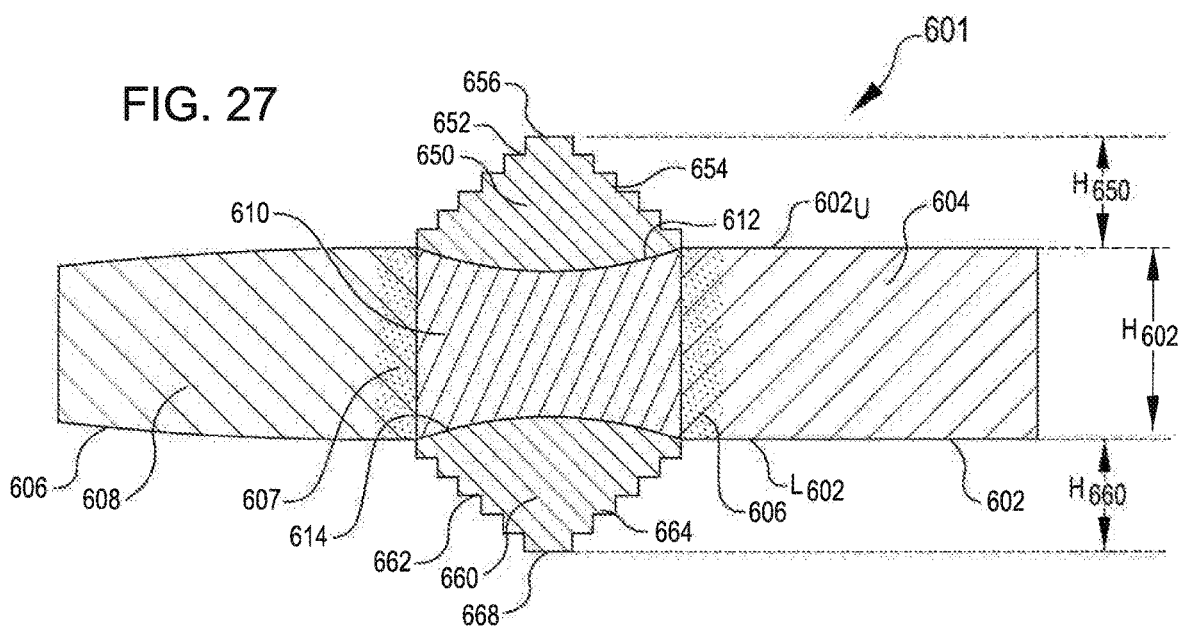

FIG. 27 is similar to the view just provided in FIG. 26 above, in that it illustrates a cross-sectional view of a welded plate and patch, with a weld nugget between the welded plate and the patch, showing heat affected zones in both the parent-metal portion and in the new-metal portion, and with additive metal portions having optimized profiles on the top and bottom surfaces of the workpiece, however, in this view the surface of the additive metal portions is provided in a stepped profile, as may be preferable in some manufacturing environments, such as some additive metal manufacturing processes.

Figure 28:
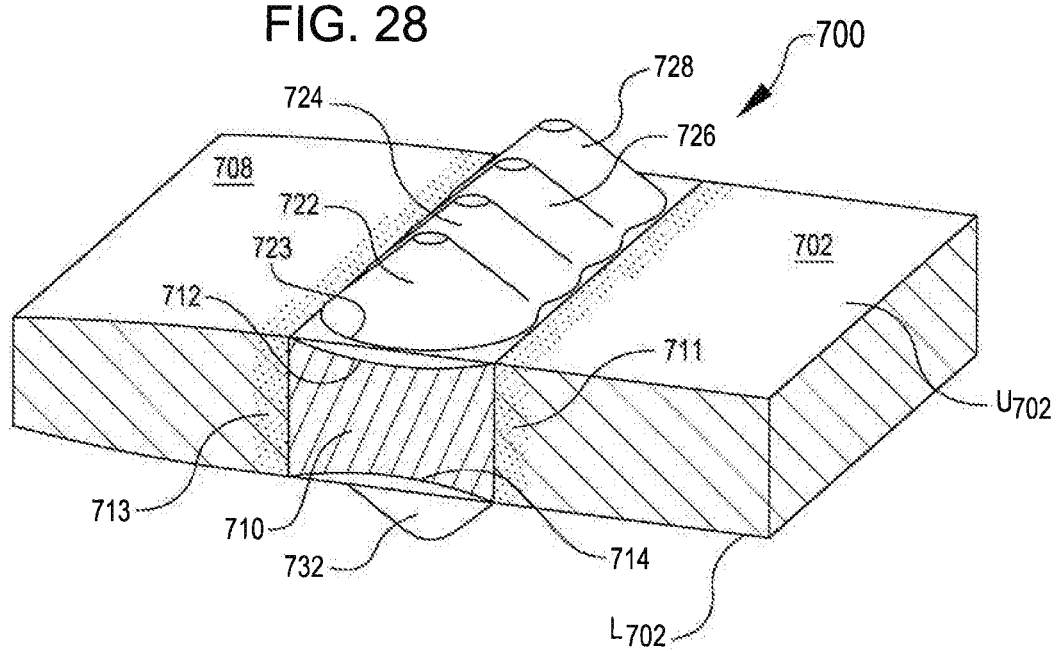

FIG. 28 is a perspective view which illustrates an embodiment for providing a welded plate and patch, with a weld nugget between the welded plate and the patch, showing heat affected zones in both the parent-metal portion and in the new-metal portion, and with additive metal portions having optimized profiles on the top and bottom surfaces of the workpiece; however, in this view the surface of the upper and lower additive metal portions is provided having a discontinuous profile, as compared to a continuous profile along the length of a weld nugget as implied in FIGS. 27 and 28 above.

Figure 29:
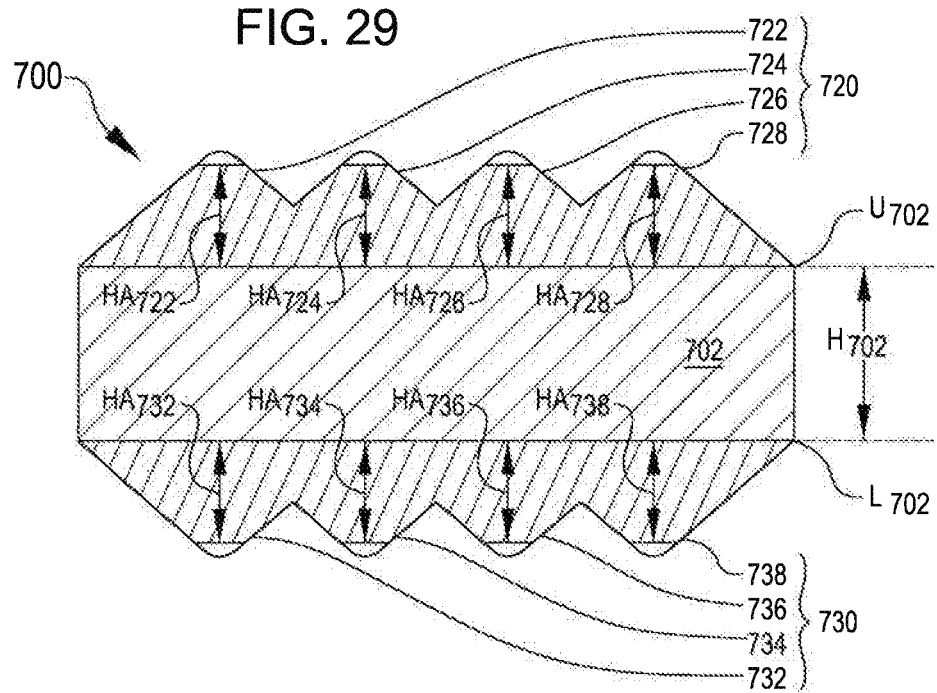

FIG. 29 is a side elevation view of the workpiece just illustrated in FIG. 28 above, and which further illustrates an embodiment for providing a welded plate and patch, with a weld nugget between the welded plate and the patch, and with additive metal portions having optimized profiles on the top and bottom surfaces of the workpiece, but in which the surface of the upper and of the lower additive metal portions is provided having a discontinuous profile, as compared to a continuous profile along the length of a weld nugget as implied in FIGS. 27 and 28 above.

Figure 30:
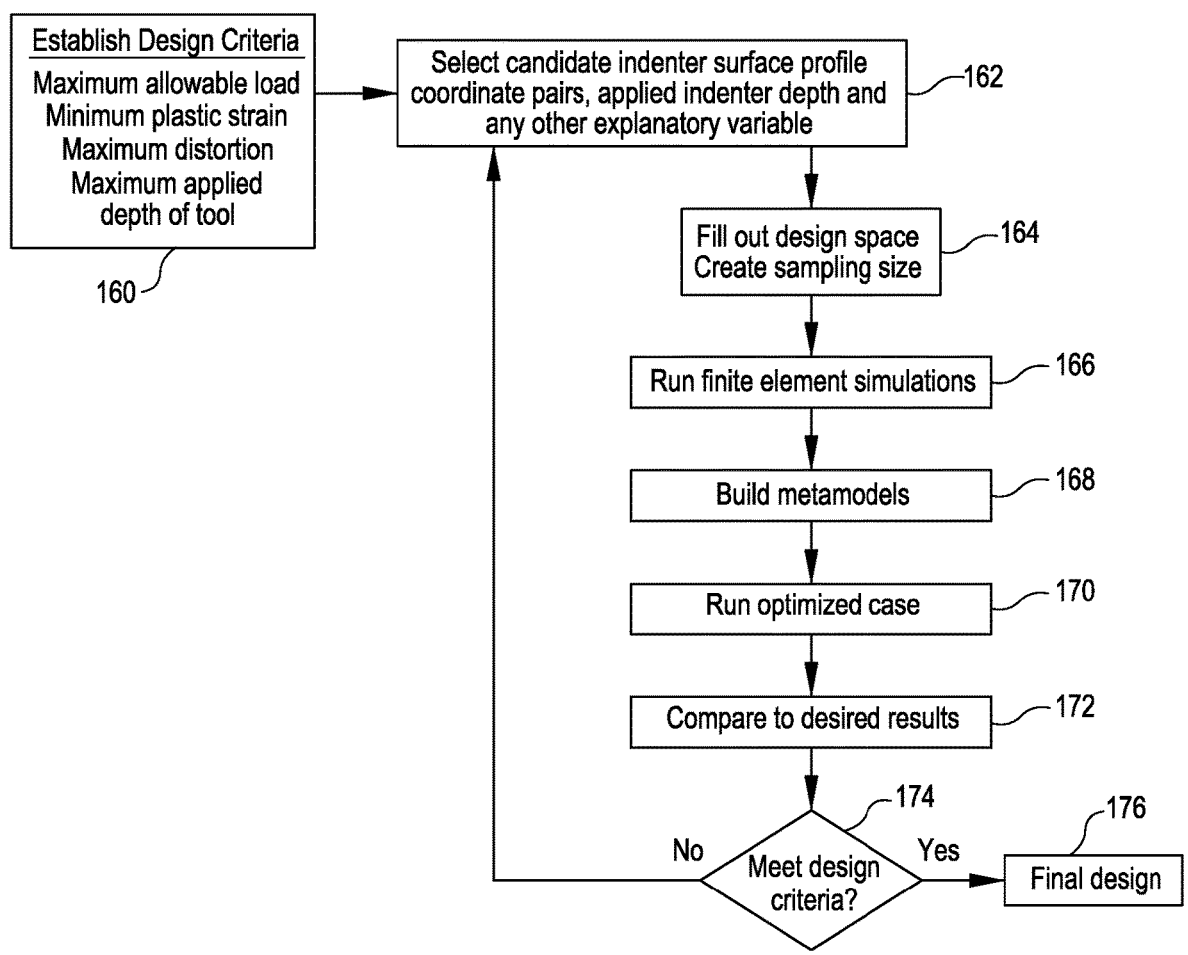

FIG. 30 provides a conceptual process flow diagram, illustrating some of the steps which may be included in some embodiments of the method for repair of rotor blades, as taught herein.

The foregoing figures, being merely exemplary, contain various elements that may be present or omitted from various embodiments for apparatus and methods that may be used to optimize indenter shapes and to produce repaired gas turbine engine integrated rotors in which the metallurgical parameters of significance for the repaired components allow the return to service of the repaired integrated rotors. An attempt has been made to draw the figures in a way that illustrates at least those elements that are significant for an understanding of the methods, workpiece assembly, and apparatus taught herein, and for the alternate configurations thereof. However, various other elements for indenter useful for the repair of integral blades on gas turbine engine rotors, and methods of use thereof, may be utilized, within the teachings hereof and within the coverage of the claims set forth herein.

DETAILED DESCRIPTION

Figure 1:
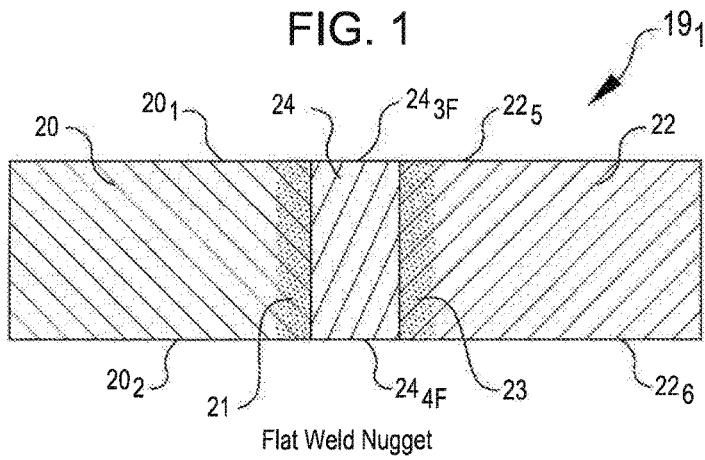

Attention is directed to FIG. 1, which illustrates a workpiece 191 which includes a weld repair structure wherein a parent-metal portion 20 and a new-metal portion 22 (alternately, may be a second parent-metal portion, if applicable) are joined by weld nugget 24. FIG. 1 also shows the heat affected zones 21 in the parent-metal portion 20 and the heat affected zones 23 in the new-metal portion 22. In an embodiment, the new-metal may be the same material (i.e. same chemical composition and heat treatment or other attributes to provide the same physical and chemical properties) as the parent-metal. The parent-metal portion 20 has a first surface $20_1$ and a second surface $20_2$. The weld nugget 24 has a third surface $24_{3F}$ and a fourth surface $24_{4F}$. The new-metal portion has a fifth surface $22_5$ and a sixth surface $22_6$. As illustrated in FIG. 1, the first surface $20_1$ of the first parent-metal portion and the fifth surface $22_5$ of the new-metal portion 22 are flat, and the third surface $24_{3F}$ of the weld nugget 24 is also flat. As illustrated, the first surface $20_1$, the third surface $24_{3F}$, and the fifth surface $22_5$, are all substantially uniform in shape—so that the parent-metal first surface $20_1$ as well as the new-metal fifth surface $22_5$ and the weld nugget third surface $24_{3F}$ all present flat surfaces against which an indenter $I_1$ (e.g., see FIG. 4) may act to create the required plastic strain in the relevant portions of the workpiece 191 as further discussed below. Similarly, as illustrated in FIG. 1, the weld nugget 24 has a flat fourth surface $24_{4F}$, which has a profile that is flat or substantially uniform in height/depth (e.g. very little or no discontinuity at the joint between the weld nugget third surface $24_{3F}$ of a weld nugget 24 and adjacent surfaces) as compared to the second surface $20_2$ of the adjacent parent-metal portion 20 and as compared to the sixth surface $22_6$ of the adjacent new-metal portion 22.

Figure 2:
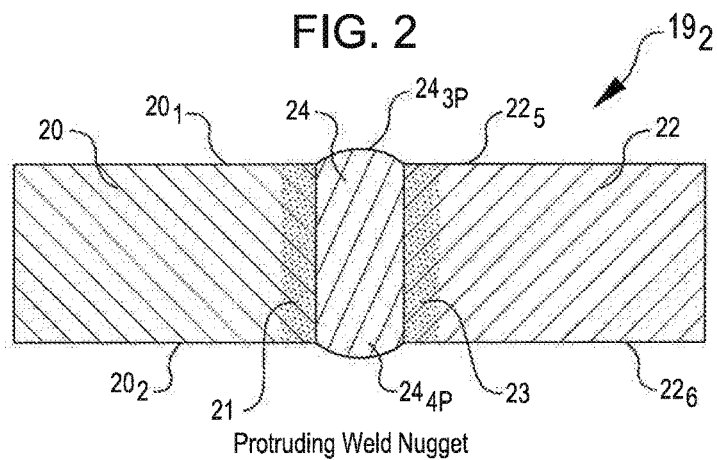

Similarly, FIG. 2 shows a weld repair structure wherein a workpiece 192 includes a weld nugget 24 that joins a parent-metal portion 20 on one side of the weld nugget 24 with a new-metal portion 22 on the other side of the weld nugget 24. FIG. 2 also shows the heat affected zones 21 in the parent-metal portion 20 and the heat affected zones 23 in the new-metal portion 22. In an embodiment, the new-metal may be the same material (i.e. same chemical composition and heat treatment or other attributes to provide the same physical and chemical properties) as the parent-metal. As illustrated in FIG. 2, the weld nugget 24 has a first protruding surface profile $24_{3P}$, which rises outwardly compared to the first surface $20_1$ of the adjacent parent-metal portion 20 and as compared to the fifth surface $22_5$ of the adjacent new-metal portion 22. Also as illustrated in FIG. 2, the weld nugget 24 has a protruding fourth surface profile $24_{4P}$, which protrudes outwardly compared to the second surface $20_2$ of the adjacent parent-metal portion 20 and as compared to the sixth surface $22_6$ of the adjacent new-metal portion 22.

Figure 3:
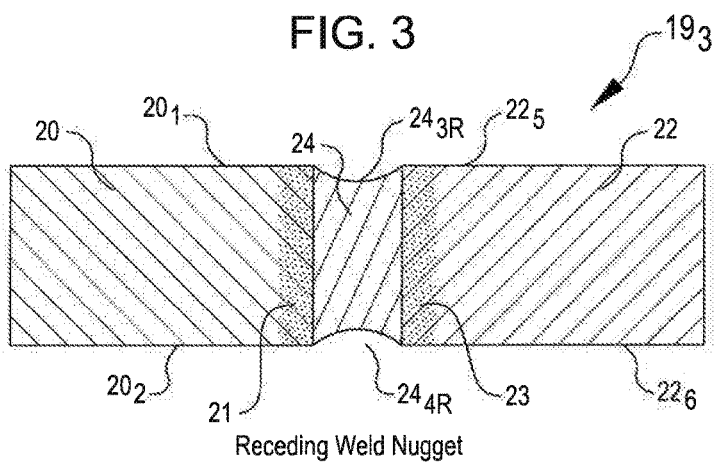

Likewise, FIG. 3 shows a weld repair structure wherein a workpiece $19_3$ includes a weld nugget 24 that joins a parent-metal portion 20 on one side of the weld nugget 24 with a new-metal portion 22 on the other side of the weld nugget 24. As illustrated in FIGS. 1 and 2 above, FIG. 3 also shows the heat affected zones 21 in the parent-metal portion 20 and the heat affected zones 23 in the new-metal portion 22. In an embodiment, the new-metal 22 may be the same material (i.e. same chemical composition and heat treatment or other attributes to provide the same physical and chemical properties) as the parent-metal 20. As illustrated in FIG. 3, the weld nugget 24 has a receding third surface profile $24_{3R}$, which recedes inwardly compared to the first surface $20_1$ of the adjacent parent-metal portion 20 and as compared to the fifth surface $22_5$ of the adjacent new-metal portion 22. Also as illustrated in FIG. 3, the weld nugget 24 has a receding fourth surface profile $24_{4R}$, which recedes inwardly compared to the second surface $20_2$ of the adjacent parent-metal portion 20 and as compared to the sixth surface $22_6$ of the adjacent new-metal portion 22.

Attention is now directed to FIG. 4, where a faceted cross-sectional indenter $I_1$ end profile is provided. As illustrated, adjacent X, Z coordinate point pairs reveal the change in shape of the working end profile 30 of the indenter $I_1$. This FIG. 4 illustrates how a series of points $30_1$, $30_2$, etc., though $30_n$ (where n is a positive integer) are defined by a series of point pairs which define the shape of the indenter working end profile 30. In an embodiment, these point pairs may be composites of the values of the preceding points $30_1$, $30_2$, etc. in the sequence, so that control of a spline curve to define the shape of the working end profile 30 produced by an optimization routine can be well controlled, using available computing capability. Here, the term faceted refers to the fact that the cross-section is not yet shown as a spline curve, but only as a series of coordinate X, Z point pairs joined by straight line segments. The origin of the working end profile begins at a point of origin 31, where X=0 and Z=0, noted as point pair $30_1$. The X and Z coordinate point pairs in addition to the point of origin 31 are shown, for example as $30_2$ at (32, 0), $30_3$ at (34, 38), $30_4$ at (35, 40) and $30_5$ at (36, 42). The first X-coordinate 32 represents a small flat region, with radius R1. This region is necessary for longer indenter $I_1$ life. The next series of points are composites of the values of the preceding points. The numbers of coordinate points are only limited by the amount of computer capacity to solve for their optimal locations. However, the method is not overly complicated, and in an embodiment, six or less coordinate points may be utilized.

FIG. 5 shows an exemplary cross-section of the working end profile shape 44 for indenter $I_2$ profile using the spline X, Z coordinates just set out in FIG. 4 above, and further showing how an indenter $I_2$ working end profile shape 44 may be defined as part of the optimization process described herein. The X, Z coordinates are the optimization variables in the optimization computation. The beginning slope angle of the spline curve at coordinate point location (R1, 0) and moving radially outward can be part of the optimization process or left at its natural blend angle of zero degrees.

FIG. 6 shows an exemplary cross-sectional working end profile 46 for an indenter $I_3$, and now additionally notes the applied depth (APD) of the indenter $I_3$, as illustrated by initial surface location (shown by broken line $47_1$) of workpiece weld nugget 47. The applied depth is the depth at which the indenter $I_3$ is loaded or displaced into the workpiece weld nugget 47. The APD parameter (a) can be fixed to set limits for the depth to which the metal may be worked to accomplish a repair, thus limiting the amount of metal that can be machined away from the workpiece weld nugget 47 (and adjacent parent-metal and new-metal, neither shown in this FIG. 6, but usually occurring as seen in FIGS. 1-3 above) to eliminate a dimpled area caused by the indenter $I_3$, or (b), can be an optimization variable.

FIG. 7 illustrates an embodiment for the setup step of a finite element analysis model that may be used in conjunction with an optimization program, in a method to determine a desirable working profile for an indenter. Here, because two planes of model symmetry occur, only a one-quarter model of the tooling, which includes weld and parent-metal portions, is required for complete solution of the X-axis symmetry plane 56 and of the Z-axis symmetry plane 48. This basis of analysis reduces the computation time required for solution without sacrificing accuracy. The one-quarter (¼) weld nugget 50, the one-quarter (¼) parent-metal 54 and one-half (½) end indenter profile 52 are the elements used in an embodiment of the finite element model.

FIG. 8 illustrates the setup required for determining the optimized indenter profile from the geometry just illustrated in FIGS. 5 and 6 above, now shown with planes of symmetry in order to show the full finite element model utilized, for clarity. As illustrated, and as useful for purposes of analysis, parent-metal 60 is enclosed in the two rectangular boxes on both the right and left hand sides of weld nugget 58 in FIG. 8. The weld nugget 58 is centered in the parent-metal 60 as indicated by the cross-hatched area between parent metal portions 60. Although parent-metal to parent-metal evaluation is useful for analysis in the determination of required indenter shape, in the usual case, the actual joint is a parent-metal to new-metal joint, wherein the properties of the new-metal are the same, or are practically indistinguishable from, the properties of the parent-metal. Upper indenter 62 and lower indenter 64 move axially toward each other during the application step, to apply force against the workpiece 65 (parent-metal 60 plus weld nugget 58 plus parent-metal 60 as shown) in order to engage the workpiece 65 and to indent the workpiece 65 to a selected tooling applied depth, as indicated in FIG. 9 below.

FIG. 9 shows the upper indenter and the lower indenter which have been driven to a specified tooling applied depth (APD)—i.e. the depth that the indenter is worked into the part being repaired—to create a barrel shaped weld nugget 58/parent-metal 60 fusion line boundary (68,70), and a region of plastic strain 66 equal to or greater than twenty five percent (25%) strain, as shown by the grey scale density (see FIG. 15), which ideally includes the entirety of the weld nugget 58 volume (i.e. to the fusion line boundary (68,70), as well as the adjacent heat affected zone 71, in the form in which that volume (weld nugget 58 plus heat affected zone 71) exists after the indenters (62, 64) have been moved axially to the selected applied depth (APD). As seen in FIG. 9, the full plastic strain scale ranges from zero percent (0%) to twenty five percent (25%) or more plastic strain. Regions at the edges are at zero plastic strain or slightly above zero plastic strain as shown by the grey scale density (see FIG. 15). For this instance the minimum threshold plastic strain of twenty five percent (25%) nearly fills the entire weld nugget 58.

FIG. 10 is similar to FIG. 9, but now demonstrates the configuration for the upper indenter 62 and the lower indenter 64 which have been driven to a specified tooling applied depth (APD), that is the depth that the indenters 62, 64) are worked into the part being repaired—to create a barrel shaped weld nugget 58/parent-metal 60 boundary (68, 70), and a region of plastic strain equal to or greater than twenty five percent (25%) strain, as shown by the grey scale density (see FIG. 15). In an embodiment, the region of plastic strain may ideally include the entirety of the weld nugget 58 volume (as it exists after the application of indenters (62, 64), as well as the adjacent heat affected zones. Here, the optimized indenter (62, 64) shape and the size of the parent-metal portions 60 and weld nugget 58 include sacrificial elements (76, 77)—outside of dashed lines (72, 74)—which are removed during a subsequent machining process.

FIG. 11 is similar to FIG. 10, but now shows the finished workpiece 65F, (as manufactured from workpiece 65 as noted in FIG. 8 above) after the removal of the sacrificial elements (76, 77) that are removed during a machining process. The sacrificial elements (76, 77) include sacrificial components of the parent-metal portions 60 (or alternately, a new-metal portion in place of one of the parent-metal portions (60) and sacrificial components of the weld nugget 58. FIG. 11 further reveals the minimum threshold strain, shown by the grey scale density (see FIG. 15), which is obtained substantially throughout the final shape of the weld nugget 58 shows the effect on plastic strain at or above the twenty five percent (25%) plastic strain threshold 66 of machining portions of the parent-metal portions 60 and weld nugget 58 (i.e. above line 72 and below line 74 in FIG. 10). This machining step as shown in FIG. 11 reveals that the minimum threshold strain 66, as indicated by the grey scale density zone (see FIG. 15) in the weld nugget, is obtained in the final shape of the weld nugget. The weld nugget 58, in the final form after working and finishing, is indicated by enclosing fusion line boundaries 68 and 70

FIG. 12 illustrates the setup required utilizing a finite element model for determining an optimized and simplified indenter 76 profile for the workpiece geometry illustrated, showing only a one-quarter model of the tooling, parent-metal 80, a weld nugget 82, and an additive welding portion 78. Because there are two planes of model symmetry, only a quarter model of the tooling (simplified indenter 76), weld nugget 82, and parent-metal 80 is required for a complete solution, using the X-axis symmetry plane 56 and Z-axis symmetry plane 48. This approach greatly reduces the computation time required for solution without sacrificing accuracy. In an embodiment, the % weld nugget 82, the one-quarter (¼) parent-metal 80 and one-half (½) end profile of simplified indenter 76 are the basic elements for use in a suitable finite element model.

FIG. 13 shows an embodiment for setting up analysis for determining an optimized indenter profile from the design just illustrated in FIG. 12 above, now shown with planes of symmetry in order to illustrate the full finite element analysis model with clarity. The parent-metal 86 is enclosed in the rectangular boxes on the right and left hand sides of weld nugget 84 in FIG. 13. The weld nugget 84, defined by cross-hatching as shown, is centered between first 8 and second M parent-metal portions 86. Upper optimized welding profile 88 and lower optimized welding profile 94 may be deposited and shaped by additive manufacturing techniques. The optimized and simplified upper indenter 90 profile and an optimized and simplified lower indenter 92 profile are provided; these indenters move axially toward each other during the application of a load on the structure by the optimized indenters.

FIG. 14 shows the result of application of force to the workpiece just illustrated in FIG. 13 above, now showing how the use of an optimized and simplified upper 90 and lower 92 indenter profiles (as seen in FIGS. 12 and 13) are utilized to drive the upper optimized welding profile 88 and lower optimized welding profile 94 to a specified depth, to provide a barrel shaped weld nugget/parent-metal boundary (96, 98), which includes a region of plastic strain 99 equal to or greater than twenty five percent (25%) plastic strain, as shown in red. In this embodiment, the minimum threshold plastic strain of twenty five percent (25%) nearly fills the entire weld nugget 84. However, the plastic strain pattern provided is shown by the range of grey scale density (see FIG. 15) in the drawing figure. Regions with little grey scale density (see FIG. 15) are at zero plastic strain or slightly above zero plastic strain. Again, in this model, the minimum threshold plastic strain of twenty five percent (25%) nearly fills the entire weld nugget 84. In this instance both the indenter profile and weld surface profile, or additive metal profile, have been simultaneously subjected to the aforementioned optimization process. Such a simultaneous method typically results in a simplified indenter shape such as a blended frustum of a cone.

Generally, minimum increase in specified plastic strain criteria to be provided after indentation is at least twenty five percent (25%) plastic strain. In yet another embodiment, the specified plastic strain criteria to be provided after indentation may be at least forty percent (40%) plastic strain. And in yet another embodiment, the specified plastic strain criteria to be provided after indentation may be at least fifty percent (50%) plastic strain. In any event, when practicing the method more explicitly set out below, whenever the plastic strain in a finished workpiece does not meet or exceed a specified plastic strain criteria in a model being analyzed by the method, then the method further includes repeating the process until a selected spline curve is determined for an indenter shape that when used with an associated indenter application depth produces at least the minimum specified plastic strain criteria for substantially all of a set of coordinate point locations in a specified volume of said weld nugget.

In yet other embodiments of the method, the method may further include, when determining whether or not the plastic strain meets or exceeds specified plastic strain criteria, the additional step of determining whether or not the plastic strain is within a selected range of uniformity of plastic strain criteria amongst a set of coordinate point locations in a finished workpiece. In an embodiment, the selected range of uniformity of plastic strain criteria for a finished workpiece may be between about twenty five percent (25%) plastic strain and about seventy five percent (75%) plastic strain. In yet another embodiment, the uniformity of plastic strain criteria for a finished workpiece may be between about thirty percent (30%) plastic strain and about sixty percent (60%) plastic strain. In yet another embodiment, the uniformity of plastic strain criteria for a finished workpiece may be between about forty percent (40%) plastic strain and about sixty percent (60%) plastic strain.

Attention is directed to FIG. 15 which provides a grey scale density chart that identifies the range of plastic strain fringe levels as illustrated in color in FIGS. 9, 10, 11 and 14.

As shown in FIG. 16, a cross-sectional view for an embodiment of an exemplary indenter 100 is provided. Here, the indenter 100 is basically shaped in the form of a conical frustum. In an embodiment, such as conical frustum may be in the form of a right circular cone where the tip of the cone has been removed as if at a cut perpendicular to the height of the cone, to provide an indenter outer end 102 which is basically circular in shape, having a minimum diameter D (ø $min_{16}$) and a radius $R_{16}$. A sloping sidewall 104 of conical shape (appearing as a straight line—and upwardly/outwardly sloping from the indenter outer end 102 as viewed in the cross-sectional view of FIG. 16) may be provided in a true conical configuration as illustrated in FIG. 16. The sloping sidewall 104 illustrated in FIG. 16 is provided at a selected conic angle (conic $angle_{16}$). In an embodiment, a blended transition having a radius $R1_{16}$ may be provided between the indenter outer end 102 and the sloping sidewall 104. In an embodiment, a blended transition having a radius $R2_{16}$ may be provided between the sloping sidewall 104 and a shoulder portion 106. In an embodiment, shoulder portion 106 may begin radially outward from and at a maximum diameter d (ø $max_{16}$) of the working end of indenter 100.

FIG. 17 illustrates an indenter 110 shaped fundamentally like a conical frustum, similar to the indenter 100 just described in FIG. 16, however, the sloping curved sidewalls 114 of indenter 110, rather than in the straight line shape of a conic section as shown for sloping sidewalls 104 of the indenter 100 of FIG. 16, are now provided, in indenter 110, in a concave, inwardly protruding fashion, and thus will be referred to herein as a pseudo conical frustum with concave shaped sloping curved sidewalls 114. As generally described in reference to indenter 100, the indenter 110 of FIG. 17 is also be similar in shape to a conical frustum, where the tip of the cone has been removed as if at a cut perpendicular to the height of the cone, to provide an indenter outer end 112 which is basically circular in shape, having a minimum diameter D (Ø $min_{17}$). A sloping curved sidewall 114 of concave shape (appearing as an inwardly curved line—and upwardly/inwardly sloping from the indenter outer end 112 as viewed in the cross-sectional view of FIG. 17) may be provided in a similar to the true conical configuration as illustrated in FIG. 16. The sloping curved sidewall 114 illustrated in FIG. 17 is provided at a selected but varying conic angle (conic $angle_{17}$), corresponding to the degree of concavity of the sloping curved sidewall 114. In FIG. 17, the indenter 110 may be provided with a blended transition having a radius $R1_{17}$ between the indenter outer end 112 and the sloping curved sidewall 114. In an embodiment, a blended transition having a radius $R2_{17}$ may be provided between the sloping curved sidewall 114 and a shoulder portion 116. In an embodiment, shoulder portion 116 may begin radially outward from and at a maximum diameter d (ø $max_{17}$) of the working end of indenter 110.

FIG. 18 illustrates an indenter 120 shaped fundamentally like a conical frustum, similar to the indenter 100 just described in FIG. 16, however, the sloping sidewalls 124 of indenter 120, rather than in the straight line shape of a conic section as shown for sloping sidewalls 104 of the indenter 100 of FIG. 16, are now provided, in indenter 120, in a convex, outwardly protruding fashion, and thus will be referred to herein as a pseudo conical frustum with convex sloping curved sidewalls 124. The convex sloping curved sidewall 124 illustrated in FIG. 18 is provided at a selected but varying conic angle (conic $angle_{18}$), corresponding to the degree of outward protrusion of the convex shape of the sloping curved sidewall 124. As generally described in reference to indenter 100, the indenter 120 of FIG. 18 is also be similar in shape to a conical frustum, where the tip of the cone has been removed as if at a cut perpendicular to the height of the cone, to provide an indenter outer end 122 which is basically circular in shape, having a minimum diameter D (ø $min_{18}$) and radius $R_{18}$. A sloping curved sidewall 124 of convex shape (appearing as an outwardly curved line—and upwardly/outwardly sloping from the indenter outer end 112 as viewed in the cross-sectional view of FIG. 18) may be provided in a similar to the true conical configuration as illustrated in FIG. 16. Similarly, in FIG. 18, the indenter 120 may be provided with a blended transition having a radius $R11_{18}$ between the indenter outer end 122 and the sloping curved sidewall 124. In an embodiment, a blended transition having a radius $R2_{18}$ may be provided between the sloping curved sidewall 124 and a shoulder portion 126. In an embodiment, shoulder portion 126 may begin radially outward from and at a maximum diameter d (e maxis) of the working end of indenter 120.

Attention is now directed to FIG. 19 and to FIG. 20 which provide illustrations of indenters 200 and 300 which have been fabricated using a faceted technique, wherein facets are provided rather than a smooth curve for the shape of the working end of the indenter 200 or 300. For example, as seen in FIG. 19, in indenter 200, a first facet 202 is provided. A second facet 204 is provided. A third facet 206 is provided. Each of the facets 202, 204, and 206 may be configured with a smoothly beveled surface at a selected angle delta (Δ) from the Z-axis 210 of the indenter 200 (e.g. angles $\Delta_{202}$ $\Delta_{204}$, and $\Delta_{206}$, respectively). In an embodiment, a flat end 208 may be provided.

Similarly, as seen in FIG. 20, in indenter 300, a first facet 302 is provided. A second facet 304 is provided. A third facet 306 is provided. Each of the facets 302, 304, and 306 may be configured with a smoothly beveled surface at a selected angle delta (Δ) from the Z-axis 310 of the indenter 300 (e.g. angles $\Delta_{302}$ $\Delta_{304}$, and $\Delta_{306}$, respectively). In an embodiment, a flat end 308 may be provided. Like indenter 200 just discussed above, indenter 300 uses a faceted technique wherein facets (e.g., facets 302, 304, and 306) are provided rather than a smooth curve for the shape of the working end of the indenter 300. However, indenter 300 additionally utilizes the technique of providing a smooth, blended radius between each facet portion. For example, as illustrated in FIG. 20, a radius $R1_{20}$ may be provided between flat end 308 and facet 306. A radius $R2_{20}$ may be provided between facet 306 and facet 304. A radius $R3_{20}$ may be provided between facet 304 and facet 302. The use of such smoothly blended radiuses may more closely approximate the shape of a spline curve which provides required plastic strain to a selected workpiece, than does an indenter without such blends, such as the sharply faceted indenter 200.

FIG. 21A illustrates a rotor blade 130 which has been damaged, and in which a repair maybe provided utilizing the method(s) taught herein. A leading edge 132 of rotor blade 130 has a damaged area 134 therein.

FIG. 21B illustrates removal of the damaged area 134 just shown in FIG. 21A above, to provide clean and undamaged surface(s), such as exemplary surfaces 140 and 142, in rotor blade 130.

FIG. 21C illustrates a damaged rotor blade 130 as just shown in FIG. 21A, and in FIG. 21B, but now showing the attachment of a new-metal repair patch 150 to the damaged rotor blade 130. Attachment of repair patch 150 may be accomplished by suitable weld techniques, and may result in weldment 152 between the repair patch 150 and the rotor blade 130.

Attention is now directed to FIG. 22, which provides a workpiece 380 in which a parent-metal portion 402 and a new-metal portion 404 have been joined by welding. In this FIG. 22, a weld nugget 406 has been formed between the parent-metal portion 402 and the new-metal portion 404. FIG. 22 also shows a first heat affected zone 432 in the parent-metal portion 402 and a second heat affected zone 434 in the new-metal portion 404. The heat affected zones 432 and 434 have been identified by fine shading. The collective area involved in the weld, namely the first heat affected zone 432, the weld nugget 406, and the second heat affected zone 436, have been collectively identified by reference numeral 440, as that volume is the material of interest in the application of force by the opposing indenters $400_1$ and $400_2$. As illustrated, additive protruding metal portions 410 and 412 are provided, against which indenters $400_1$ and $400_2$ act, respectively. Additionally, note that parent-metal portion 402 includes a first curved surface portion 416 and a second curved surface portion 418. The new-metal portion 404 includes a third curved surface portion 420 and a fourth curved surface portion 422.

In FIG. 23, a repair setup similar to that just shown in FIG. 22 is provided. FIG. 23 provides a cross-sectional view of a workpiece 500, illustrating the set up for the use of a pair of indenters, e.g. upper indenter 502 and lower indenter 504 on the workpiece 500. The workpiece 500 includes a first parent-metal portion 510 which for example may be a rotor blade, and a repair patch 512, which have been joined together by welding. As will usually be the case, the new-metal portion, e.g., repair patch 512 as illustrated, should be provided of sufficient thickness (see $T_{512}$), as compared to the thickness $T_{510}$ of parent-metal portion 510, so that the new metal portion, i.e. repair patch 512, can accept a dimple on both the top 513 and the bottom 515 surfaces, and then be machined to a final shape that matches those surfaces which are being replaced. Here, a weldment or nugget is indicated by thick line 514, and a heat affected zone 516 in first parent-metal portion 510, and a heat affected zone 517 is illustrated in repair patch 512. Additionally, a first or upper additive protruding metal portion 520 is provided on a first side 522, and a second or lower additive protruding metal portion 530 is provided on a second side 532.

Further clarity is provided by the close up set out in the partial cross-sectional view of FIG. 24. FIG. 24 shows parent-metal portion 510 and the repair patch 512, as well as upper indenter 502 and lower indenter 504. The entire workpiece may be better understood by reference to FIG. 25, which also shows workpiece 500, including the parent-metal portion 510, the upper additive protruding metal portion 520, the lower additive protruding metal portion 530, and the repair patch 512.

Advantageous methods for preparation of a workpiece in order to achieve uniform plastic strain in both original and added metal alloy materials may be understood by reference to FIGS. 26, 27, 28, and 29. In FIG. 26, a cross-sectional view of a workpiece 600 including a parent-metal portion 602 in the form of a plate 604 having a height $H_{604}$, and a new-metal portion 606 in the form of a patch 608, are connected via weld nugget 610. FIG. 26 also shows the heat affected zones 605 in the parent-metal portion 602 and the heat affected zones 607 in the new-metal patch portion 606. The weld nugget 610 has a weld nugget upper surface profile 612. And, the weld nugget 610 has a weld nugget lower surface profile 614. As illustrated in FIG. 26, the weld nugget upper surface profile 612 and the weld nugget lower surface profile 614 may have a receding profile, as first discussed with reference to FIG. 3 above, noted by reference numbers $24_{3R}$ and $24_{4R}$ therein. However, it should be noted that the weld nugget upper surface profile 612 and the weld nugget lower surface profile 614 may also be provided with a protruding profile as illustrated in FIG. 2 above, as noted by reference numbers $24_{3P}$ and $24_{4P}$ therein, or with a flat profile, as illustrated in FIG. 1 above, as noted by reference numbers $24_{3F}$ and $24_{4F}$ therein. In any event, an upper additive metal portion 620 is provided. In an embodiment, the upper additive metal portion 620 may be provided in a continuous linear fashion (thus having the same shape longitudinally as illustrated in the cross-section of FIG. 26), with a first upper sidewall 622 and a second upper sidewall 624 having an upper profile angle alpha ($\alpha$) therebetween. In an embodiment the apex between first upper sidewall 622 and the second upper sidewall 624 may be provided as an upper profile radius 626 to provide a smooth curve therebetween. The upper additive metal portion 620 may have an upper profile metal height $H_{620}$ above an upper surface $U_{602}$ of parent-metal 602. Likewise, a lower additive metal portion 630 is provided. In an embodiment, the lower additive metal portion may be provided in a continuous linear fashion (thus having the same shape longitudinally as illustrated in the cross-section of FIG. 26), with a first lower sidewall 632 and a second lower sidewall 634 having a lower profile angle beta ($\beta$) therebetween. In an embodiment the apex between first lower sidewall 632 and the second lower sidewall 634 may be provided as a lower profile radius 636 to provide a smooth curve therebetween. The lower additive metal portion 630 may have a lower profile metal height $H_{630}$ below a lower surface $L_{602}$ of parent-metal 602. Preparation of workpiece 600 in the manner illustrated may simplify the requirements for manufacture of an indenter for use in providing work to the workpiece 600, i.e. squeeze the workpiece with the force necessary to create substantially uniform plastic strain, in the manner discussed above in reference to FIGS. 12, 13, and 14, to allow final machining for removal of excess metal and ultimate return to service of a repaired component such as a rotor.

FIG. 27 illustrates another embodiment for a workpiece 601, but is in many ways identical or very similar to the view just provided in FIG. 26 above, so like features are referenced with identical reference numbers, dispensing with the need for further mention thereof. In an embodiment, an upper additive metal portion 650 may be provided in a continuous linear fashion (thus having the same shape longitudinally as illustrated in the cross-section of FIG. 27), with a first stepped upper sidewall 652 and a second stepped upper sidewall 654. In an embodiment, even though stepped in shape, the first stepped upper sidewall 652 and a second stepped upper sidewall 654 may have an upper stepped profile angle therebetween, similar to upper profile angle alpha ($\alpha$) illustrated in FIG. 26 above. In an embodiment the apex between first upper sidewall 652 and the second upper sidewall 654 may be provided as an upper blunt profile 656 to provide a smooth transition therebetween. The upper additive metal portion 650 may have an upper additive metal height $H_{650}$ above an upper surface $U_{602}$ of parent-metal 602. Likewise, a lower additive metal portion 660 is provided. In an embodiment, the lower additive metal portion 660 may be provided in a continuous linear fashion (thus having the same shape longitudinally as illustrated in the cross-section of FIG. 27), with a first lower stepped sidewall 662 and a second lower stepped sidewall 664 having a lower profile angle beta ($\beta$) therebetween. In an embodiment the apex between first lower sidewall 632 and the second lower sidewall 634 may be provided as a lower blunt profile 668 to provide a smooth transition therebetween. The lower additive metal portion 660 may have a lower profile metal height $H_{660}$ below a lower surface $L_{602}$ of parent-metal 602. Preparation of workpiece 601 in the manner illustrated may simplify the requirements for manufacture of an indenter for use in providing work to the workpiece 601 to create substantially uniform plastic strain, in the manner discussed above in reference to FIGS. 12, 13, and 14, to allow final machining for removal of excess metal and ultimate return to service of a repaired component such as a rotor.

Turning now to FIGS. 28 and 29, a workpiece 700 is illustrated to show the alternative use of a discontinuous upper additive metal portion 720 and a discontinuous lower additive metal portion 730 located above and below, respectively, a weld nugget 710 which connects a parent-metal plate 702 and a new-metal patch 708. FIG. 28 also shows the heat affected zones 711 in the parent-metal plate 702 and the heat affected zones 713 in the new-metal patch portion 708.

The perspective view in FIG. 28 clearly shows a first upper additive shape 722, a second upper additive shape 724, a third upper additive shape 726, and a fourth upper additive shape 728, all forming a part of the upper additive metal portion 720 (see FIG. 29). Similarly, as better seen in FIG. 29, the discontinuous lower additive metal portion 730 includes a first lower additive shape 732, a second lower additive shape 734, a third lower additive shape 736, and a fourth lower additive shape 738. Plate 702 has a height $H_{702}$, an upper surface $U_{702}$ and a lower surface $L_{702}$. One or more of the the upper additive metal portions (722, 724, 726, and 728) and one or more of the the lower additive metal portions (732, 734, 736, and 738) may be configured to extend above upper weld profile 712 and more specifically above the upper surface $U_{702}$ for a distance $HA_{722}$, $HA_{724}$, $HA_{726}$, and $HA_{728}$ or to extend below the lower weld profile 714 and more specifically below the lower surface $L_{702}$ for a distance $HA_{732}$, $HA_{744}$, $HA_{736}$, and $HA_{738}$, respectively.

With respect to the use of additive weld profiles as just described in connection with FIGS. 26, 27, 28, and 29, for best results, observance of some practical limits may be useful. First, the initial height (e.g. height $H_{722}$ of upper additive metal portion 722 in FIG. 29) of the additive metal portion should be equal to or less than the thickness of the original workpiece (e.g. height $H_{702}$ of plate 702 in FIG. 29). And, the final height of a squeezed additive metal portion must be above the original surface (e.g. upper surface U 702 of plate 702 in FIG. 29) of the workpiece. This allows for excess metal to be machined and blended into the original workpiece profile, as illustrated by FIG. 10 above. Also, in a preferred embodiment, a base of the additive metal portion (e.g. base 723 of additive metal portion 722 in FIG. 28) should not be wider than the weld nugget (e.g. weld nugget 710 in FIG. 28), to confine the base of the additive metal portion to the weld and adjacent heat affected zones. Thus, the width of the base of an additive metal portion is important, since if the base of the additive metal portion were wider than the weld nugget, then the additive metal portion would be subjected to the same grain growth as the method described herein directed to fixing in the first place. Consequently, any welds and adjacent heat affected zones within the original workpiece profile must be plastically strained to the required threshold plastic strain, or otherwise there would be deleterious grain growth in the affected metal structure.

In various embodiments, the relative longitudinal spacing of the additive metal portions may be configured to correspond to the spacing of action on the workpiece by indenters (e.g. multiple action on a work piece by indenters acting on both the top and bottom of a workpiece) during their application. Leaving some space between each additive metal portion may also reduce the overall distortion encountered in a finally processed workpiece after such a weld repair. In other words, after welding of a plate or part to a patch, then providing additive metal portions, and squeezing the workpiece by applying force utilizing indenter sized and shaped as detailed herein to provide the appropriate plastic strain, and then machining of excess portions to provide a smooth finished part, should result in minimization of distortion in the finished, weld repaired workpiece. In one aspect of the embodiments taught herein, reduced processed weld repair distortion is accomplished by removing metal that is not directly involved in the processing of the weld. Removing the excess metal has the effect of precluding additional post indenter process residual stress in the weld repair.

Depending on the repair size required, the use of an additive metal portion may eliminate the need for the use of an additional patch. In general, the smaller the size of the required repair area, the more likely no patch will be required. In any event, the additive metal portion should be provided of the same metal alloy, and provide the same mechanical strength as the parent-material, after heat treatment. Further, the additive metal portions should not have any voids, as may be present in some types of additive manufacturing methods.

Shapes for additive weld portions may vary, but when viewed in cross-section, additive metal portions provided by additive welds are most advantageously provided in a generally triangular in shape, but may be preferably provided with a smoothly contoured upper or lower portion, such as by use of a radiused top or bottom, as appropriate for upper and lower additive metal portions. And, in some additive metal manufacturing procedures, an additive metal portion may be provided in a generally stepped fashion (see FIG. 27), like a ziggurat. As the number of steps increases the stepped shape looks more and more like a smooth additive metal portion shape, and the overall slope of each side may approach that of a smooth angled surface for an additive metal portion. The maximum number of steps in an additive metal portion may be limited by the height of metal layer deposition that is feasible by use of a particular additive metal manufacturing process. Such a shape may be a very practical shape from the point of the view of some welders, depending on equipment being utilized. And, as noted in FIGS. 28 and 29, it is not necessary for additive metal portions to be uniform in shape or continuous along a path across a workpiece above and below a new weld nugget.

FIG. 30 provides a conceptual process flow diagram, illustrating some of the steps which may be included in some embodiments of the method for repair of rotor blades, as taught herein. In such embodiments, the method may be initiated by establishing design criteria as noted at step 160. Such design criteria may include any one or more of the maximum allowable load to be applied, the maximum plastic strain to be achieved in the workpiece, and the maximum distortion which may be allowable in the workpiece to be acted on by an indenter configured according to the method of design taught herein.

Next, as noted at step 162, a candidate indenter surface profile as defined by a set of coordinate pairs is selected, utilizing an applied indenter depth and other explanatory or defining variables selected. From such an "initial exemplary indenter" a design space is filled out as noted at step 164, in fulfillment of a sample size selected. From such an initial exemplary indenter design, a set of finite element simulations are run at step 166, and such simulations are then utilized build a set of indenter models, when may be considered metamodels, at step 168. From this initial set of indenter models, an optimized indenter shape is developed. Then, the optimized indenter shape is utilized in a finite element analysis to provide results of an optimized case, as shown in step 170. The results are then compared to the desired results, as shown in step 172, to determine if the results provided by the candidate optimized indenter shape achieves the design criteria for a particular repair, as noted at step 174. If the candidate optimized indenter shape achieves the desired design criteria for the repair, then the optimization is concluded, and the final design 176 for an indenter for a particular project is in hand. If the desired design criteria are not achieved, then the process is returned to the step of selecting a candidate indenter surface profile, and the process is repeated.

As can be seen by reference to FIGS. 19 and 20, the method just described above may be practiced by using an indenter shape such as faceted indenters 200 or 300. In such case, the method may be modified after the step of determining a selected spline curve which defines an indenter shape that when used with an associated indenter application depth provides a plastic strain result for substantially all specified coordinate point locations a finished workpiece which meets or exceeds a specified plastic strain criteria, by further determining the shape of a suitable faceted indenter. Such a method further comprises first providing an initial user input for defining points of a faceted indenter (e.g. 200, 300) having a shape which approximates the shape of a selected spline curve. Then, endpoint boundary conditions are identified for scaling such a faceted indenter having a shape which approximates the shape of a selected spline curve. Then, initial user input is provided for defining boundary conditions for acceptable indentation application depth for a faceted indenter (e.g., 200, 300) having a shape which approximates the shape of a selected spline curve. Next, for each faceted indenter having a shape which approximates the shape of a selected spline curve, as well as for each one of the faceted indenter application depths, a plastic strain result for each of specified coordinate point locations in the workpiece is determined. Then, a determination is made as to whether or not the plastic strain result for each of specified coordinate point locations in the workpiece meets or exceeds the plastic strain criteria for a finished workpiece. In the event that the plastic strain results do not meet or exceed the plastic strain criteria for each of the specified coordinate point locations in a finished workpiece, the process is repeated until a faceted indenter having a shape which approximates the shape of a selected spline curve is determined which defines an indenter shape that when used with an associated indenter application depth provides a plastic strain result for substantially all specified coordinate point locations a finished workpiece which meets or exceeds a specified plastic strain criteria.

The method described herein may be practiced utilizing a finite element analysis conducted using commercially available software packages. Once useful example is the LS-DYNA software package provided by Livermore Software Technology Corporation. LS-YNA is a general-purpose finite element program capable of simulating complex real-world problems. It is widely used by the automobile, aerospace, construction, military, manufacturing, and bioengineering industries. The code's origins lie in highly nonlinear, transient dynamic finite element analysis using explicit time integration. Further, optimization can be conducted on commercially available software packages, especially those linked to a finite element solver. One useful software package for this purpose is LS-OPT software, also developed by Livermore Software Technology Corporation (LSCT), currently located at 7334 Las Postas Road, Livermore, Calif. 94551. See: http://www.lstc.com/products/ls-dyna. The just noted software is a standalone design optimization and probabilistic package with an interface to LS-DYNA. The optimization capability in LS-OPT is based on Response Surface Methodology and Design of Experiments. Such software may be utilized by providing an initial user input for defining points of a faceted indenter having a shape which approximates the shape of a selected spline curve. The usual user inputs include parent-material specifications, new-metal material specifications, the dimensions (usually width) of the weld nugget and of the adjacent heat affected zones, the surface profiles of the parent-material, surface profiles of the new-metal, and the surface profile(s) of the weld, and the thickness of the parent-material, of the new-metal, and of the weld, and for a specific situation, the maximum load allowed to be applied by the indenter, and the related parameter of the maximum distortion allowed in the workpiece. Then the endpoint boundary conditions are identified for scaling such a faceted indenter having a shape which approximates the shape of a selected spline curve. Then, initial user input is provided for defining boundary conditions for acceptable indentation application depth for a faceted indenter having a shape which approximates the shape of a selected spline curve.

By use of the method(s) taught herein, a remanufactured integrally bladed rotor for an aircraft engine, or a refabricated rotor blade for a gas turbine engine, generally, may be provided. Such workpieces include a parent-metal portion having a grain structure, a new-metal portion, and a weld nugget between the parent-metal portion and the new-metal portion. The weld nugget is formed by welding the parent-metal portion and the new-metal portion together. In such fabrication or remanufacture, adjacent the weld nugget, a heat affected zone extends into the parent-metal portion and into the new-metal portion. As set forth in the method described above, the weld nugget and the heat affected zone have specified coordinate point locations therein. The weld nugget, the heat affected zone, and at least some of the new-metal portion, have all been worked by application of one or more indenters as described above to provide plastic strain for each of the specified coordinate point locations which meets or exceeds the plastic strain criteria specified for the integrally bladed rotor, or rotor blade, as applicable. Surprisingly, after heat treatment, the method provides in the remanufactured or repaired apparatus, in the weld nugget and in the heat affected zone, a recrystallized grain structure comparable to the grain structure in the parent material.

In an embodiment, the integrally bladed rotor or rotor blade may be worked so that the specified plastic strain criteria is at least twenty five percent (25%) plastic strain. In an embodiment, the integrally bladed rotor or rotor blade may be worked so that the specified plastic strain criteria is at least forty percent (40%) plastic strain. In an embodiment, the integrally bladed rotor or rotor blade may be worked so that the specified plastic strain criteria is at least fifty percent (50%) plastic strain.

In the foregoing description, numerous details have been set forth in order to provide a thorough understanding of the disclosed exemplary embodiments for apparatus and methods for repair of rotor blades for gas turbine engines. However, certain of the described details may not be required in order to provide useful embodiments, or to practice selected or other disclosed embodiments. Further, the description may include, for descriptive purposes, various relative terms such as surface, at, adjacent, proximity, near, on, onto, and the like. Such usage should not be construed as limiting. Terms that are relative only to a point of reference are not meant to be interpreted as absolute limitations, but are instead included in the foregoing description to facilitate understanding of the various aspects of the disclosed embodiments. Various components are described which may be employed alternatively, yet be included in some designs or components for use in a particular situation. Accordingly, the method(s) described herein may be utilized in whole or in part in various discrete operations, in a manner that is most helpful in a particular circumstance. However, the order of description should not be construed as to imply that such alternatives are necessarily order dependent, or that use of various components is necessarily in the alternative. Also, the reader will note that the phrase "in one embodiment" has been used repeatedly. This phrase generally does not refer to the same embodiment; however, it may. Finally, the terms "comprising", "having" and "including" should be considered synonymous, unless the context dictates otherwise.

Various aspects and embodiments described and claimed herein may be modified from those shown without materially departing from the novel teachings and advantages provided by this invention, and may be embodied in other specific forms without departing from the spirit or essential characteristics thereof. Embodiments presented herein are to be considered in all respects as illustrative and not restrictive or limiting. This disclosure is intended to cover methods and apparatus described herein, and not only structural equivalents thereof, but also equivalent structures. Modifications and variations are possible in light of the above teachings. Therefore, the protection afforded to this invention should be limited only by the claims set forth herein, and the legal equivalents thereof.

The invention claimed is:

1. A method for determining a shape for an indenter for use in effecting a workpiece to optimize residual strain in the workpiece after application of the indenter to the workpiece at an applied indentation depth, where the workpiece comprises (1) at least one parent-metal portion, (2) at least one new-metal portion, and (3) at least one weld nugget portion and adjacent heat affected zones in the at least one parent-metal portion and in the at least one new-metal portion, said method comprising:
   (a) providing initial user input for defining points of at least a portion of a spline curve;
   (b) identifying endpoint boundary conditions for scaling the spline curve;
   (c) processing the user input to scale at least a portion of a spline curve;
   (d) calculating a plurality of splines curves according to the identified endpoint boundary conditions;
   (e) providing an initial user input for defining boundary conditions for acceptable indentation application depth for an indenter having a shape according to one of the spline curves identified from the spline curve calculations;
   (f) calculating, for each one of said spline curves and each one of said indenter application depths, a plastic strain result for each of specified coordinate point locations in said workpiece;
   (g) determining whether or not the plastic strain result for each of specified coordinate point locations in said weld nugget portion and adjacent heat affected zones in said workpiece meets or exceeds a Specified plastic strain criteria for a finished workpiece; and
   (h) if the plastic strain results do not meet or exceed the plastic strain criteria for each of the specified coordinate point locations in a finished workpiece, repeating the process until a selected spline curve is determined for an indenter shape that when used with an associated indenter application depth provides a plastic strain result for substantially all specified coordinate point locations in a finished workpiece which meets or exceeds the specified plastic strain criteria.

2. The method as set forth in claim 1, wherein said specified plastic strain criteria is at least twenty five percent (25%) plastic strain.

3. The method as set forth in claim 1, wherein said specified plastic strain criteria is at least forty percent (40%) plastic strain.

4. The method as set forth in claim 1, wherein said specified plastic strain criteria is at least fifty percent (50%) plastic strain.

5. The method as set forth in claim 1, wherein said plastic strain does not meet or exceed a specified plastic strain criteria, and wherein said method further comprises repeating the process until a selected spline curve is determined for an indenter shape that when used with an associated indenter application depth produces the specified plastic strain criteria for substantially all of a set of coordinate point locations in a specified volume of said weld nugget.

6. The method as set forth in claim 1, wherein said method of determining whether or not said plastic strain result meets or exceeds specified plastic strain criteria comprises determining whether or not said plastic strain is within a selected range of uniformity of plastic strain criteria amongst a set of coordinate point locations in a finished workpiece.

7. The method as set forth in claim 6, wherein said selected range of uniformity of plastic strain criteria for a finished workpiece is between about twenty five percent (25%) plastic strain and about seventy five percent (75%) plastic strain.

8. The method as set forth in claim 6, wherein said uniformity of plastic strain criteria for a finished workpiece is between about thirty percent (30%) plastic strain and about sixty percent (60%) plastic strain.

9. The method as set forth in claim 6, wherein said uniformity of plastic strain criteria for a finished workpiece is between about forty percent (40%) plastic strain and about sixty percent (60%) plastic strain.

10. The method as set forth in claim 1, wherein said endpoint boundary conditions for scaling the spline curve are determined by (a) size of the weld nugget, (b) size of said adjacent heat affected zone in said parent-metal portion, and (c) size of said adjacent heat affected zone in said new-metal portion.

11. The method as set forth in claim 10, further comprising minimizing applied depth necessary for the indenter to achieve the indentation application depth, while maintaining acceptable uniformity of plastic strain for substantially all locations in (a) said weld nugget portion, (b) in said heat affected zones in said adjacent parent-metal portions, and (c) in said heat affected zones in said adjacent new-metal portions of said workpiece, by determining minimum applied depth necessary for the indenter to achieve the indentation application depth which provides said acceptable uniformity of plastic strain for substantially all locations in (1) said weld nugget portion, (2) in said heat affected zones in said adjacent parent-metal portions, and (3) in said heat affected zones in said new-metal portions of said workpiece.

12. The method as set forth in claim 1, wherein providing an initial user input for defining boundary conditions for acceptable indentation application depth comprises providing an upper limit of applied depth.

13. The method as set forth in claim 1, wherein providing an initial user input for defining boundary conditions for acceptable indentation application depth comprises providing an upper limit of applied force necessary for the indenter to achieve the indentation application depth.

14. The method as set forth in claim 13, further comprising minimizing applied force necessary for the indenter to achieve the indentation application depth, while maintaining an acceptable uniformity of plastic strain for substantially all locations in (a) said weld nugget portion, (b) in said heat affected zones in said adjacent parent-metal portions, and (c) in said heat affected zones in said adjacent new-metal portions of said workpiece, by determining a minimum amount of applied force necessary for the indenter to achieve an indentation application depth which provides said acceptable uniformity of plastic strain for substantially all locations in (1) said weld nugget portion, (2) in said heat affected zones in said adjacent parent-metal portions, and (3) in said heat affected zones in said new-metal portions of said workpiece.

15. The method as set forth in claim 14, wherein said uniformity of specified plastic strain criteria for a finished workpiece is between about twenty five percent (25%) plastic strain and about thirty percent (30%) plastic strain.

16. The method as set forth in claim 1, wherein the spline curve is a cubic spline curve.

17. The method as set forth in claim 1, or in claim 15, wherein the workpiece comprises a gas turbine engine rotor blade.

18. The method as set forth in claim 17, wherein said gas turbine engine rotor blade comprises an integrally bladed rotor, and wherein said workpiece comprises a blade on said integrally bladed rotor.

19. The method as set forth in claim 1, wherein said initial user input for defining points of at least a portion of a spline comprises input approximating a centerline surface profile of a conical frustum.

20. The method as set forth in claim 19, wherein said centerline surface profile of said conical frustum is selected to approximate size, in combination, of (1) a selected weld nugget, (2) adjacent heat affected zone in said parent-metal portion, and (3) adjacent heat affected zone in said new-metal portion of the workpiece.

21. The method as set forth in claim 20, wherein said conical frustum has a lower plane of diameter D and an upper plane of diameter d, and a height H between the lower plane and the upper plane, and a sloping sidewall of length S between outer edge of D and d, and wherein said user input further comprises providing a radiused edge between a planar surface defined by r and the sloping sidewall S.

22. The method as set forth in claim 21, wherein said conical frustum further comprises a blended, smoothly curved surface outwardly protruding from upper plane of radius r.

23. The method as set forth in claim 1, wherein said initial user input for defining points of at least a portion of a spline comprises input approximating a centerline surface profile of a pseudo conical frustum.

24. The method as set forth in claim 23, wherein said centerline surface profile of said pseudo conical frustum is selected to approximate (a) weld nugget size, (b) adjacent heat affected zone size in said parent-metal portion, and (c) adjacent heat affected zone in said new-metal portion of said workpiece.

25. The method as set forth in claim 24, wherein said pseudo conical frustum has a lower plane of radius R and an upper plane of radius r, and a height H between the lower plane and the upper plane, and a curved sloping sidewall of length CS between outer edge R and outer edge r.

26. The method as set forth in claim 25, wherein said user input further comprises providing a radiused edge between a planar surface defined by r and the curved sloping sidewall CS.

27. The method as set forth in claim 25, wherein said curved sloping sidewall of length CS between the outer edge of R and the outer edge of r comprises an inwardly curved concave shape.

28. The method as set forth in claim 25, wherein said curved sloping sidewall of length CS between the outer edge of R and the outer edge of r comprises an outwardly curved convex shape.

29. The method as set forth in claim 25, wherein said pseudo conical frustum further comprises a blended, smoothly curved surface outwardly protruding from upper plane of radius r.

30. The method set forth in claim 1, where said workpiece comprises a parent-metal portion having a first surface and a second surface, and wherein said weld nugget has a third surface and a fourth surface, and where said first surface and said third surface comprise a substantially uniform common surface.

31. The method set forth in claim 30, where said new-metal portion comprises a fifth surface and a sixth surface, and wherein said fifth surface and said third surface comprise a substantially uniform common surface.

32. The method set forth in claim 1, where said parent-metal portion has a first surface and a second surface, and wherein said weld nugget has a third surface and a fourth surface, and where said second surface and said fourth surface comprise a substantially uniform common surface.

33. The method set forth in claim 32, where said new-metal portion comprises a fifth surface and a sixth surface, and wherein said sixth surface and said fourth surface comprise a substantially uniform common surface.

34. The method set forth in claim 1, where said parent-metal portion has a first surface and a second surface, and wherein said weld nugget has a third surface and a fourth surface, and wherein said new metal portion has a fifth surface and a sixth surface, and wherein said first surface, said third surface, and said fifth surface comprise a substantially uniform common surface.

35. The method set forth in claim 1, where said parent-metal portion has a first surface and a second surface, and wherein said weld nugget has a third surface and a fourth surface, and where said second surface and said fourth surface comprise a substantially uniform common surface.

36. The method set forth in claim 35, where said new-metal portion has a fifth surface and a sixth surface, and wherein said second surface, said fourth surface, and said sixth surface comprise a substantially uniform common surface.

37. The method as set forth in claim 1, wherein the workpiece further comprises at least one additive metal portion, and wherein determining the shape of an indenter for use in effecting a workpiece to optimize residual strain in the workpiece after application of the indenter to the workpiece at an applied indentation depth comprises determining the shape of an indenter for use where the workpiece comprises at least one parent-metal portion, at least one new-metal portion, at least one weld nugget portion, and at least one additive metal portion.

38. The method as set forth in claim 37, wherein the workpiece comprises at least one upper additive metal portion located above said parent metal portion, and at least one lower additive metal portion located below said parent metal portion.

39. The method as set forth in claim 37, wherein said at least one weld nugget portion comprises an upper weld profile surface and a lower weld profile surface, and wherein either the upper weld surface profile or the lower weld surface profile, or both, are optimized, to provide an optimized indenter surface profile.

40. A method for determining a shape for an indenter for use in effecting a workpiece to optimize residual strain in the workpiece after application of the indenter to the workpiece at an applied indentation depth, where the workpiece comprises at least one parent-metal portion, and at least one weld nugget portion, and a heat affected zone in said at least one parent-metal portion adjacent said at least one weld nugget portion, said method comprising:

(a) providing an initial user input for defining points of at least a portion of a spline curve;
(b) identifying endpoint boundary conditions for scaling the spline curve;
(c) processing the user input to scale a curve in the spline;
(d) calculating a plurality of splines curves according to the identified endpoint boundary conditions;
(e) providing an initial user input for defining boundary conditions for acceptable indentation application depth for the an indenter having a shape according to one of the spline curves identified from the spline curve calculations;
(f) calculating, for each one of said spline curves and each one of said indenter application depths, a plastic strain result for each of specified coordinate point locations in said workpiece;
(g) determining whether or not the plastic strain result for each of specified coordinate point locations in said weld nugget portion and adjacent heat affected zones in said workpiece meets or exceeds a specified plastic strain criteria applicable for a finished workpiece; and
(h) if the plastic strain results do not meet or exceed the plastic strain criteria for each of the specified coordinate point locations in a finished workpiece, repeating the process until a selected spline curve is determined an indenter shape that when used with an associated indenter application depth provides a plastic strain result for substantially all specified coordinate point locations in said workpiece which meets or exceeds a specified plastic strain criteria.

41. The method as set forth in claim 40, wherein the spline curve is a cubic spline curve.

42. The method as set forth in claim 40, wherein said endpoint boundary conditions for scaling the spline curve are determined by (a) weld nugget size and (2) an adjacent heat affected zone size in said parent-metal portion.

43. The method as set forth in claim 40, wherein providing an initial user input for defining boundary conditions for acceptable indentation application depth comprises providing an upper limit of applied force necessary for the indenter to achieve the indentation application depth.

44. The method as set forth in claim 40, wherein said method of determining whether or not said plastic strain meets or exceeds specified plastic strain criteria comprises determining whether or not said plastic strain meets a selected uniformity of plastic strain criteria amongst a set of coordinate point locations in a finished workpiece.

45. The method as set forth in claim 44, wherein said selected uniformity of plastic strain criteria is at least twenty five percent (25%) plastic strain.

46. The method as set forth in claim 44, wherein said uniformity of plastic strain criteria for a finished workpiece is between about twenty five percent (25%) plastic strain and about thirty percent (30%) plastic strain.

47. The method as set forth in claim 44, wherein said plastic strain does not meet a specified plastic strain criteria, and wherein said method further comprises repeating the process until a selected spline curve is determined for an indenter shape that when used with an associated indenter application depth produces the specified plastic strain criteria for substantially all of a set of coordinate point locations in a specified volume of said weld nugget.

48. The method as set forth in claim 47, wherein said specified volume of said workpiece comprise heat affected zones in said parent-metal portions, where said parent-metal portions are adjacent said weld nugget.

49. The method as set forth in claim 48, further comprising minimizing applied force necessary for the indenter to achieve the indentation application depth, while maintaining said uniformity of plastic strain for substantially all locations in the volume of said weld nugget portion and in adjacent parent-metal portions of said workpiece, by determining a minimum amount of applied force necessary for the indenter to achieve the indentation application depth which provides acceptable uniformity of plastic strain for substantially all locations in the volume of said weld nugget portion and in adjacent parent-metal portions of said workpiece.

50. The method as set forth in claim 49, wherein said uniformity of specified plastic strain criteria for a finished workpiece is between about twenty five percent (25%) plastic strain and about thirty percent (30%) plastic strain.

51. A method for repair of a selected workpiece, said selected workpiece comprising a damaged gas turbine rotor, said method comprising:

(a) providing a gas turbine rotor having a parent metal with a specified metallurgical composition, a specified plastic strain criteria, and a damaged portion, as a workpiece;
(b) removing said damaged portion from said workpiece to provide a repair interface with said parent metal;
(c) providing a new-metal portion, said new metal portion having metallurgical properties compatible with and substantially similar to metallurgical composition of said parent metal of said gas turbine rotor;
(d) welding said new-metal portion to said workpiece at said repair interface, to produce a workpiece having a parent metal portion, a weld nugget, and a new-metal portion, and a heat affected zone in said parent metal portion adjacent said weld nugget, and a heat affected zone in said new-metal portion adjacent said weld nugget; and
(e) determining a shape for an indenter for use in effecting a workpiece to optimize residual strain in the workpiece after application of the indenter to the workpiece at an applied indentation depth, where the workpiece comprises at least one parent-metal portion, at least one new-metal portion, and at least one weld nugget portion, wherein determining the shape of an indenter comprises:
  (1) providing an initial user input for defining points of at least a portion of a spline curve;
  (2) identifying endpoint boundary conditions for scaling the spline curve;
  (3) processing the user input to scale a curve in the spline;
  (4) calculating a plurality of spline curves according to the identified endpoint boundary conditions;
  (5) providing an initial user input for defining boundary conditions for acceptable indentation application depth for the an indenter having a shape according to one of the spline curves identified by calculating a plurality of spline curves according to the identified endpoint boundary conditions;
  (6) calculating, for each one of said spline curves and each one of said indenter application depths, a plastic strain result for each of specified coordinate point locations in said workpiece;

(7) determining whether or not the plastic strain result for each of specified coordinate point locations in said weld nugget portion and adjacent heat affected zones in said workpiece meets or exceeds a specified plastic strain criteria for a finished workpiece;

(8) if the plastic strain results do not meet or exceed the plastic strain criteria for each of the specified coordinate point locations in a finished workpiece, repeating the process until a selected spline curve is determined which defines an indenter shape that when used with an associated indenter application depth provides a plastic strain result for substantially all specified coordinate point locations a finished workpiece which meets or exceeds a specified plastic strain criteria;

(f) indenting said workpiece with said indenter; and (g) machining said new-metal portion to remove excess metal, and to conform the workpiece to substantially to an original size and shape of said gas turbine rotor.

52. The method as set forth in claim 51, wherein said method of determining whether or not said plastic strain meets or exceeds specified plastic strain criteria comprises determining whether or not said plastic strain meets a selected uniformity of plastic strain criteria amongst a set of coordinate point locations in a finished workpiece.

53. The method as set forth in claim 52, wherein said selected uniformity of plastic strain criteria is at least twenty five percent (25%) plastic strain.

54. The method as set forth in claim 52, wherein said uniformity of plastic strain criteria for a finished workpiece is between about twenty five percent (25%) plastic strain and about thirty percent (30%) plastic strain.

55. The method as set forth in claim 1, or in claim 40, or in claim 51, wherein determining the shape of an indenter further comprises, after determining a selected spline curve which defines an indenter shape that when used with an associated indenter application depth provides a plastic strain result for substantially all specified coordinate point locations a finished workpiece which meets or exceeds a specified plastic strain criteria, (1) providing an initial user input for defining points of a faceted indenter having a shape which approximates the shape of a selected spline curve;

(2) identifying endpoint boundary conditions for scaling said faceted indenter having a shape which approximates the shape of a selected spline curve;

(3) providing an initial user input for defining boundary conditions for acceptable indentation application depth for a faceted indenter having a shape which approximates the shape of a selected spline curve;

(4) calculating, for each faceted indenter having a shape which approximates the shape of a selected spline curve and each one of said indenter application depths, a plastic strain result for each of specified coordinate point locations in said workpiece;

(5) determining whether or not the plastic strain result for each of specified coordinate point locations in said weld nugget portion and adjacent heat affected zones in said workpiece meets or exceeds the plastic strain criteria for a finished workpiece; and (6) if the plastic strain results do not meet or exceed the plastic strain criteria for each of the specified coordinate point locations in a finished workpiece, repeating the process until a faceted indenter having a shape which approximates the shape of a selected spline curve is determined which defines an indenter shape that when used with an associated indenter application depth provides a plastic strain result for substantially all specified coordinate point locations a finished workpiece which meets or exceeds a specified plastic strain criteria.

56. The method as set forth in claim 55, wherein the faceted indenter is provided with a plurality of facets.

57. The method as set forth in claim 56, wherein the faceted indenter further comprises radiused blended surfaces between each one of said plurality of facets.

58. The method as set forth in claim 51, wherein the workpiece further comprises at least one additive new-metal portion, and wherein determining the shape of an indenter for use in effecting a workpiece to optimize residual strain in the workpiece after application of the indenter to the workpiece at an applied indentation depth comprises determining the shape of an indenter for use where the workpiece comprises at least one parent-metal portion, at least one additive new-metal portion, at least one weld nugget portion, and one or more additive metal portion.

59. The method as set forth in claim 58, wherein the method further comprises determining the size and shape of each of said one or more additive new-metal portions, and wherein the step of determining the size and shape of each of said one or more additive new-metal portions comprises determining the shape of each of said one or more additive metal portions in combination with the step of determining the shape of an indenter to be used in effecting said workpiece, by optimizing residual strain in the workpiece after application of the indenter to the workpiece at an applied indentation depth.

* * * * *

UNITED STATES PATENT AND TRADEMARK OFFICE
CERTIFICATE OF CORRECTION

PATENT NO. : 11,225,868 B1
APPLICATION NO. : 16/261374
DATED : January 18, 2022
INVENTOR(S) : Eric T. Easterbrook It is certified that error appears in the above-identified patent and that said Letters Patent is hereby corrected as shown below:

On the Title Page

Item (57) Abstract, at Line 10, after the words, "methods may be used", delete "to".

On page 2, Column 1, Line 20, under "References Cited, U.S. Patent Documents", delete "68,997,738" and substitute therefore --6,899,773 B2--.

On page 2, Column 2, Line 1, under "Foreign Patent Documents", delete "10198209" and substitute therefore --101908209--.

In the Specification

Column 3, Line 15, after the words "herein may be used", delete "to".

Column 4, Line 65, after the words "a spine is", insert --a--.

Column 9, Line 67, after the words "other elements for", delete "indenter" and substitute therefore --indenters--.

Column 10, Line 9, after the word "piece", delete "191" and substitute therefore --$19_1$--.

Column 10, Line 32, after the words "the workpiece", delete "191" and substitute therefore --$19_1$--.

Column 10, Line 33, after the words "weld nugget 24 has a", delete "flat".

Column 10, Line 42, after the word "workpiece", delete "192" and substitute therefore --$19_2$--.

Column 10, Line 67, after the words "new-metal", insert --portion--.

Column 13, Line 16, after the words "strain threshold", delete "66".

Signed and Sealed this
Sixth Day of December, 2022

*Katherine Kelly Vidal*

Katherine Kelly Vidal
*Director of the United States Patent and Trademark Office*

Column 13, Line 23, after the word "the", delete "final".

Column 13, Line 24, after the "70", insert --.--.

Column 13, Line 36, after the words "embodiment, the", delete "%" and substitute therefore --1/4--.

Column 13, Line 47, after the words "centered between first", delete "8 and second M"" and substitute therefore --$86_1$ and second $86_2$--.

Column 15, Line 63, after the words "a radius", delete "$R11_{18}$" and substitute therefore --$R1_{18}$--.

Column 16, Line 2, delete "(e maxis)" and substitute therefore --(ø $max_{18}$)--.

Column 19, Line 11, after the words "of the", delete "the".

Column 19, Line 12, after the words "more of the", delete "the".

Column 19, Line 19, after the words "distance $HA_{732}$,", delete "$HA_{744}$" and substitute therefore --$HA_{734}$--.

Column 19, Line 28, after the words "upper surface", delete "U 702" and substitute therefore --$U_{702}$--.

Column 19, Line 57, after the words "force utilizing", delete "indenter" and substitute therefore --indenters--.

Column 21, Line 43, after the word "Corporation.", delete "LS-YNA" and substitute therefore --LS-DYNA--.

In the Claims

Column 23, Line 51, after the words "or exceeds", delete "Specified" and substitute therefore --specified--.

Column 30, Line 38, after the words "additive metal", delete "portion" and substitute therefore --portions--.